Figure 1:
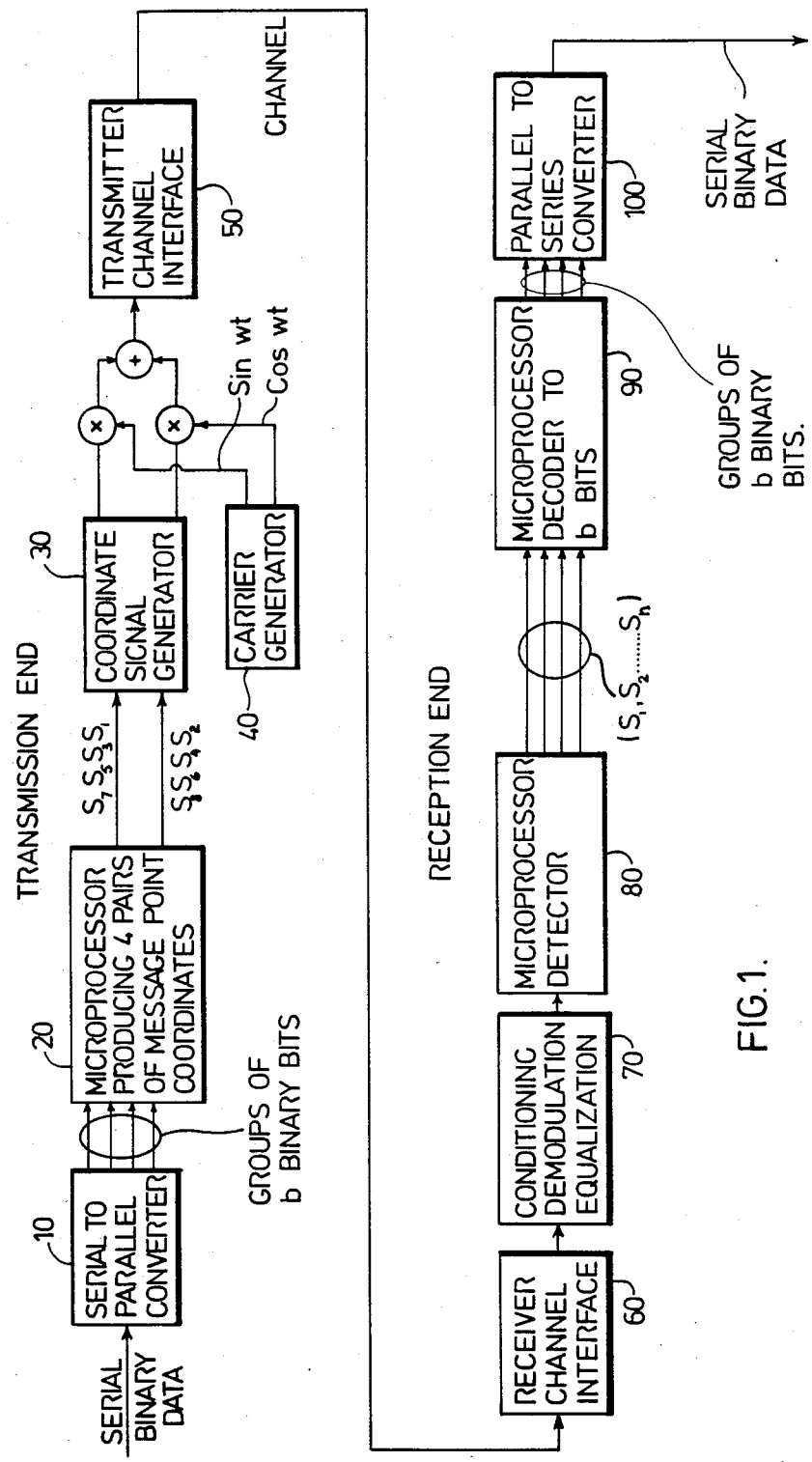

United States Patent [19]

Longstaff et al.

[11] Patent Number: 4,630,288
[45] Date of Patent: Dec. 16, 1986

[54] DATA TRANSMISSION WITH BLOCK CODING

[75] Inventors: Fred M. Longstaff, Islington; Gordon R. Lang, Bolton, both of Canada

[73] Assignee: Motorola Canada Limited, North York, Canada

[21] Appl. No.: 584,235

[22] Filed: Feb. 27, 1984

Related U.S. Application Data

[63] Continuation-in-part of Ser. No. 563,976, Dec. 21, 1983.

[51] Int. Cl.$^4$ ............................................. H04L 23/02
[52] U.S. Cl. ........................................ 375/39; 371/37; 370/21
[58] Field of Search ............... 375/38, 39, 43; 371/37; 370/20, 21; 455/60

[56] References Cited

U.S. PATENT DOCUMENTS 3,887,768  6/1975  Forney, Jr. et al. .................. 375/42

Primary Examiner—Robert L. Griffin
Assistant Examiner—Raymond C. Glenny
Attorney, Agent, or Firm—Westell & Hanley

[57] ABSTRACT

An encoder treats a block of b bits of binary data as a number N and encodes it into eight values S1, S2 . . . S8 identifying it. The eight values are each selected from positive, negative and zero integer values; and the values are chosen so that a set of eight consists of all even integers or all odd integers and so that the sum of the eight values is 0 modulo 4. In the transmitter these values are modulated on a carrier for transmission. A receiver detects the received versions of the transmitted values, determining the number N and reconstituting the block of b bits.

14 Claims, 1 Drawing Figure

DATA TRANSMISSION WITH BLOCK CODING

This application is a continuation-in-part of application Ser. No. 563,976 Filed Dec. 21, 1983.

This invention relates to a means and method of transmitting binary data modulated on a carrier over a communications channel.

The means and method of the invention utilize the fact that a block of 8 independent signals transmitted modulated of a carrier on a communication channel each of selectable value and sign can be considered as defining a message point in 8 dimensional space and that a block of b binary bits may conveniently be encoded in such block of 8 independent signals so that the message point thus defined identifies the b binary bits. These 8 signals are transmitted modulated on a carrier on a communications channel and detected at a receiver. The receiver is equipped with decoding means to reconstitute the block of b bits from the 8 signals detected.

In most cases the 8 signals will be modulated on a carrier using QAM modulation so that the 8 signals will be transmitted as in four pairs or bauds. However, the method of modulation is not relevant to the scope of the invention.

Prior arrangements of signalling binary information have employed 2 dimensional signal structures. (See for example U.S. Pat. No. 3,887,768 to G. D. Forney Jr. et al). It is well known, that for a given number of signal points in a 2 dimensional space, some structures provide better performance than others. It is less well known that some signal structures in higher dimensional spaces might provide performance that is superior to any known 2 dimensional structure. Moreover, the means and method for encoding to and decoding from such higher dimensional structures have not been available.

It is an object of this invention to provide means and a method of encoding blocks b of binary data into 8 signals which define points in 8 dimensional space arranged in accord with the rules:

the 8 signals in an encoded block have values proportional to integral values which integral values in a given block:

(a) must be all even or all odd integers
(b) the total of the integral values must be 0 modulo 4

Block coding by this method shows (for example) a coded signal to noise ratio performance of about 3 dB of advantage over an encoded 2 dimensional approach.

To apply the inventive coding means and method, when applied to signalling at a given number of bauds per second, the eight independent signal values that are available in a four baud interval, (assuming QAM) are employed to signal the coordinates of a point in 8 dimensional signal space. (It will be realized that although QAM is preferred the invention applies where the 8 values are modulated serially or in any other paired arrangement, or in another manner). Under the above criteria examples of the number of signal points required at 2400 baud are:

| Signalling rate bits/sec | No. of message points |
|---|---|
| 2400 | $2^4$ |
| 4800 | $2^8$ |
| 9600 | $2^{16}$ |
| 12000 | $2^{20}$ |
| 14400 | $2^{24}$ |

The term "independent" in the phrase eight independent values should be qualified. Each value is independent in the sense that it may be mathematically and physically varied without affecting any of the other values. However in the preferred encoding means and method presented the values must, when normalized to integers, satisfy the criteria a and b previously mentioned and are interdependant only to this extent.

In conventional quadrature amplitude modulation, two independent signal values are transmitted in each baud interval. They may be considered to represent the coordinates of a point in two dimensional space. To minimize errors due to noise, the minimum separation between points should be maximized; while to minimize signal energy requirements the energy required to produce the signal values for modulation on the carrier should be small. The separation between points may be expressed as $\sqrt{(S1a-S1b)^2+(S2a-S2b)^2}$ where S1a, S2a and S1b, S2b are the coordinates of the two signal points. (In practice it is more convenient to deal with the separation squared e.g. $(S1a-S1b)^2+(S2a-S2b)^2$. It will be noted that the separation will vary as modulating voltage and the separation squared as modulating power. Assuming that the pattern of message points is centred at the origin a measure of the power required to signal the coordinate pair and hence of the signal energy is, for the point S1a, S2a, proportional to $S1a^2+S2a^2$.

As previously expressed, considerable signal to noise improvement can be obtained by transmitting a block of 8 independent signals (preferably with QAM in four baud intervals) whose values may then be considered as defining a point in 8 dimensional space. Such 8 independent signal values may be represented as S1, S2 ... S8. The square of the distance between two message points S1a,S2a ... S8a and S1b,S2b ... S8b is $$\sum_{k=1}^{k=8} (Ska - Skb)^2$$

and the power required to signal the first point is proportional to $$\sum_{k=1}^{k=8} Ska^2.$$

The densest known packing of (8 dimensional) spheres in 8 dimensional space is described by the rules for the coordinates, previously expressed.

(a) The coordinates must be proportional to 8 even integers or to 8 odd integers
(b) The sum of the coordinates treated as integers must be 0 modulo 4

Each message point, corresponding to a block of 8 signal values, has 240 nearest neighbours at a distance $2\sqrt{2}$. For example, the points adjacent to the origin are:

1. 112 points with coordinates of represented by signal values of the combination of two 2's either of which may be positive or negative and six 0's. It will be noted that the permutations of the absolute values of this combination provide 28 alternatives and that the permissible sign changes or permutation provide 4 sub alternatives for each absolute value permutation.

2. 128 points with all coordinates represented by signal values each of which may be ±1. Once the choice of positive or negative is made for seven signal values the sign of the eighth is dictated by rule (b) above.

It is convenient to consider the 8 block encoded signals S1, S2 ... S8 as defining a point, known herein as a message point, in 8 dimensional space. Each of S1,S2 ... S8 may assume a sequence of positive and negative values spaced by a constant value C. In it is convenient and is the approach and terminology used herein to normalize the value C to 1 so that S1,S2 ... S8 are treated as assuming integral values.

It might be more accurate to say that in the inventive means and method disclosed herein each of S1,S2...S8 is determined as a selected integral value and such values control the physical values of the corresponding 8 signals transmitted. In this approach the "distance" between two message points or its square (a measure of the risk of one of the two being confused with the other on reception and detection) is calculated using the Pythagorean formula for 8 dimensions giving $$\sum_{k=1}^{k=8} (Sak - Sbk)^2$$

as the square of the distance between two message points Sa1,Sa2 ... Sa8 and Sb1, Sb2 ... Sb8. Again using the Pythagorean relationship, where the pattern of message points Sa1, Sa2 ... Sa8 is centred about the origin which has coordinates consisting of eight zeros, the power required to signal the Sa point will vary as $$\sum_{k=1}^{k=8} (Sak)^2.$$

It is convenient, and part of the preferred means and method of this invention, to classify the message points as lying on shells preferably ordered to be of increasing distance from a datum. A shell is defined herein as the locus of message points whose distance from the datum is equal. If the coordinates of the datum are Sd1, Sd2 ... Sd8 then a shell would be those message points Ss1, Ss2 ... Ss8 for which $$\sum_{k=1}^{k=8} (Ssk - Sdk)^2$$

is the same. It should be noted that, for the preferred methods of encoding and decoding disclosed herein, the datum is the origin, i.e. each of Sd1, Sd2, ... Sd8 is equal to zero and a shell is then those message points where $$\sum_{k=1}^{k=8} Ssk^2$$

is the same.

When the central datum is the origin as 8 zeros, each shell is treated as divided into sub-shells where a sub-shell consists of message points differing only in signs and permutation. That is the combination of absolute values S1,S2 ... Sk will be the same for all message points in a sub-shell. E.g. points (4, 2, 2, 0, 0, 0, 0, 0); (0, 2, 0, 4, 0, 2, 0, 0) and (4, −2, 0, −2, 0, 0, 0, 0), have the same combination of absolute values of 4,2,0 and are treated as located on the same sub-shell. Table A shows 1344 permutations for the combination 42200000 shell 3b.

The first 5 shells and part of the sixth are given in Table A. Each shell has been divided into sub-shells. The column headed "Sum" is the sum of the points of all preceeding sub-shells. It will be realized that the table entitled 'coordinates' lists the coordinates to be used in the combination of the sub-shell. Each such combination represents the number of message points which is the product of the "Perm" (i.e. permutation) and "Sign" (i.e. permissible sign selection changes) columns and appears in the "Points" column.

TABLE A.

| Shell | Coordinates Permutations of | PT* | Perm. | Sign. | Points | Sum |
|---|---|---|---|---|---|---|
| 1a | 22000000 | 2 | 28 | 4 | 112 | 0 |
| 1b | 11111111 | 0 | 1 | 128 | 128 | 112 |
| 2a | 22220000 | 7 | 70 | 16 | 1120 | 240 |
| 2b | 40000000 | 1 | 8 | 2 | 16 | 1360 |
| 2c | 31111111 | 1 | 8 | 128 | 1024 | 1376 |
| 3a | 22222200 | 2 | 28 | 64 | 1792 | 2400 |
| 3b | 42200000 | 5 | 168 | 8 | 1344 | 4192 |
| 3c | 33111111 | 2 | 28 | 128 | 3584 | 5536 |
| 4a | 22222222 | 0 | 1 | 256 | 256 | 9120 |
| 4b | 42222000 | 8 | 280 | 32 | 8960 | 9376 |
| 4c | 44000000 | 2 | 28 | 4 | 112 | 18336 |
| 4d | 33311111 | 4 | 56 | 128 | 7168 | 18448 |
| 4c | 51111111 | 1 | 8 | 128 | 1024 | 25616 |
| 5a | 42222220 | 3 | 56 | 128 | 7168 | 26640 |
| 5b | 44220000 | 9 | 420 | 16 | 6720 | 33808 |
| 5c | 62000000 | 3 | 56 | 4 | 224 | 40528 |
| 5d | 33331111 | 7 | 70 | 128 | 8960 | 40752 |
| 5e | 53111111 | 3 | 56 | 128 | 7168 | 49712 |
| 6a | 44222200 | 9 | 420 | 64 | 26880 | 56880 |
| . | . | . | . | . | . | . |

*Permutation Type

As will be noted, Table 1 arranges the shells in increasing distance from the origin (which may easily be verified by summing the squares of the coordinates). For many purposes of encoding and signalling it will be advantageous to use all the shells outwardly from the origin until the required amount of message points are available. Some sub-shells require the use of one or more high valued coordinates which coordinates require high peak voltage and power. Hence it will sometimes be advantageous to omit sub-shells in the encoding ( and decoding) process in favour of sub-shells further distant from the origin at a small cost in signal to noise ratio. For instance in the sub-shells of Table 1 sub-shell 5c contributes only 224 message points, and is the only occurrence (in the table as developed) of a coordinate as large as 6. (The large coordinate implies a higher voltage and power input). Removal of this line from the table and consequent adjustment of the "Sum" column would cause these points to be unused with a decrease of peak voltage and power requirements at a small penalty in signal to noise ratio.

It will also be noted that the origin point (coordinates 0,0,0,0,0,0,0,0) is not treated as an available point for encoding. It could easily be used by an adjustment of table 1 but for a number of reasons it may be desireable to avoid the origin. Such reasons will include the programming or processing capacity required to add a single message point and the complexities of dealing with the origin if differential encoding is used.

To detect received message points it is preferred to use the simple detection process put forward by J. H. Conway and N. J. A. Sloane, see "Fast Quantizing and Decoding Algorithms for Lattice Quantizers and Codes"; IEEE Transactions on Information Theory, Vol. IT-28, No.2 March 1982. However, it should be emphasized that the claimed invention as well as its advantages and features are independent of the detection process used and that use of an alternative to the preferred detection process is considered within the scope of the invention which scope is independent of the detection method. (This should not obscure the fact that more accurate detection is achieved, whatever the detection method used, because of the use and advantages of the invention). In the method of Conway and Sloane, each received coordinate of a fourbaud block (each baud representing two signals S) is quantized, once as a sequence of even integers and once as a sequence of odd integers. It may happen that the modulo 4 check sum will fail on either or both sequences. In such a case the worst component, i.e. that furthest from an integral value (i.e. with S1,S2 ... Sn normalized to integers) is rounded "the wrong way" in order to satisfy the modulo 4 requirement. Thus two "candidate" quantized sequences are obtained. Of this the candidate with the smallest squared distance from the unquantized received coordinates (e.g. where $$\sum_{k=1}^{k=8} (Suk - Sqk)^2$$

(where Suk is the unquantized signal and Sqk the corresponding quantized signal)) is chosen to be the set of eight coordinates most likely transmitted. This is an exact "maximum likelihood detection process" for signal points arranged in accord with the rules (a) and (b) referred to previously.

The inventive encoding means and method provide for the encoding of binary data in blocks of b bits into blocks of eight signals S1, S2, ... S8 for modulation on a carrier and transmission where the coordinate values S1,S2 ... S8 of the same block may be considered as defining a message point in 8 dimensional space and the values of each of S1,S2 ... S8 are selected from a series of equally spaced values treated as integers. The blocks used for signals have coordinates chosen so that no two points are closer than $2\sqrt{2}$ in the integral units used for the coordinate values. The means and method determines a number N which identifies the block of b bits. (Usually N is the value obtained where the b bits are considered as a binary number). A table of ranges of values of N is provided with corresponding shells. The shell will have enough message points to represent all values of N in the range. Means selects the shell corresponding to the value of N and provides a number representative of the location of N in the range. Using this information the means and method provide the coordinates S1,S2, ... S8 identifying the location of N in the range chosen from the shell obtained from the table. Means are provided so that values S1,S2,... S8 are then physically modulated on the carrier. At the receiver means are provided to detect the values S1, S2, ... S8 and hence the range of N. Means are also provided to determine the location of N in the range and hence N. Means convert N into the input b bits which are then available at the receiver as the originally transmitted b binary bits. Considerable improvement in signal to noise ratio and transmission speed may be achieved with the invention.

In the preferred form of the invention the coordinates are chosen to be all odd or all even and so that their sum satisfies the 0 modulo 4 rule and the message points are chosen to be arranged in shells about the origin. In encoding, the table gives sub-shells corresponding to ranges of N and each sub-shell has the same combination of absolute values of coordinates. Permutation masks are provided to control the permutation of the absolute values of coordinates and a mask controls the selection of the positive or negative signs of the non zero coordinates. The location of N in the range is used to determine the selection of permutation masks and hence the particular coordinates S1,S2, ... S8 identifying the number N. When the values of these coordinates are modulated on a carrier, transmitted demodulated and detected, means is provided at the decoder for regaining the value of N. Such means determines the absolute values of the detected coordinates and the sign permutation masks. The absolute values of the coordinates allow determination of the range of N while the permutation of the absolute values provides value permutation masks equivalent to those used at the encoder. With the range and these decoder masks, the value of N is recovered at the receiver from which the value of b is recovered.

There will now be described a preferred means and method involving a microprocessor program for encoding (at one end of the channel) and detecting and decoding (at the other end of the channel). The program is designed so that, at the modem at each end of the communications channel, a single microprocessor may perform all the encoding steps and another microprocessor, all the decoding steps. For these purposes we prefer to use the microprocessors known as Models 68B02 (encoding) and 68B09 (detecting and decoding) manufactured by Motorola Inc. of 1303 Fast Algonquin Rd, Schaumberg ILL.

ENCODING

At a data rate of 14,4000 bits per second, the data to be transmitted in one frame consists of 24 bits which may be considered as a number, N, in the range from 0 to 16,777,215. At 12,000 bits per second, only 20 bits are required which may be considered as a number, N, in the range from 0 to 1,048,575. At 9,600 bits per second, only 16 bits are required which may be considered as a number, N, in the range from 0 to 65,535. The number, N, may be converted to a group of 8 coordinates to be transmitted by the following algorithm.

Step 1 Scan the main encoding table (table 1) to find the entry for which the value in the offset column is a large as possible but does not exceed N. The data in the rest of this entry will be used to control the rest of the encoding process.

Step 2 Subtract the value in the offset column from N giving a difference D. So far we have selected a sub-shell corresponding to the table entry and we will use the value of D to select a message point from within this sub-shell.

Step 3 Divide D by 2B where B is the value given in the Sign bits column. Let the quotient be R. Mutiply the remainder by 2(8−B) a nd let this be S. R will now be used to control the permutation of the coordinates. S is now an 8 bit quantity whose high order B bits will be used to control the signs of the coordinates Step 4 If the coord. type is EVEN, ignore this step. If the coord. type is ODD adjust the low order bit of S so that the number of ones in the binary representation of S is odd or even corresponding to the value in the sign parity column.

Step 5 We now generate four permutation masks, mask 1 to mask 4, each of 8 bits, using the procedure below corresponding to the value in the perm. type column. Any masks not specified by the procedure are set to all ones.

| Perm. type | Mask Settings |
|---|---|
| 0 | Leave all mask values as all ones. |
| 1 | Use R to look up mask 1* in table M87. |
| 2 | Use R to look up mask 1 in table M86. |
| 3 | Divide R by 28. Use remainder to look up mask 1 in table M86. Use quotient to look up mask 2 in table M21. |
| 4 | Use R to look up mask 1 in table M85. |
| 5 | Divide R by 56. Use remainder to look up mask 1 in table M85. Use quotient to look up mask 2 in table M82. |
| 6 | Divide R by 56. Use remainder to look up mask 1 in table M85. Use quotient to look up masks 2 and 3 in table M311. |
| 7 | Use R to look up mask 1 in table M84. |
| 8 | Divide R by 70. Use remainder to look up mask 1 in table M84. Use quotient to look up mask 2 in table M83. |
| 9 | Divide R by 70. Use remainder to look up mask 1 in table M84. Use quotient to look up mask 2 in table M82. |
| 10 | Divide R by 70. Use remainder to look up mask 1 in table M84. Use quotient to look up masks 2 and 3 in table M421. |
| 11 | Divide R by 70. Use remainder to look up mask 1 in table M84. Use quotient to look up masks 2, 3 and 4 in table M4111. |
| 12 | Divide R by 56. Use remainder to look up mask 1 in table M83. Use quotient to look up mask 2 in table M83. |
| 13 | Divide R by 56. Use remainder to look up mask 1 in table M83. Use quotient to look up masks 2 and 3 in table M531. |
| 14 | Divide R by 56. Use remainder to look up mask 1 in table M83. Use quotient to look up masks 2 and 3 in table M522. |
| 15 | Divide R by 56. Use remainder to look up mask 1 in table M83. Use quotient to look up masks 2, 3 and 4 in table M5211. |
| 17 | Divide R by 420. Use quotient to look up mask 3 in table M82. Divide remainder by 28. Use new remainder to look up mask 1 in table M82. Use new quotient to look up mask 2 in table M82. |
| 18 | Divide R by 420. Use quotient to look up masks 3 and 4 in table M421. Divide remainder by 28. Use new remainder to look up mask 1 in table M82. Use new quotient to look up mask 2 in table M82. |

*The phrase, "look up Mask 1" (or Mask 2 etc.) is used in the program instructions which follow as an abbreviation for "look up the value of Mask 1" (or Mask 2 etc.).

Step 6 Steps 7 to 13 are now repeated eight times to generate the 8 coordinates in turn.

Step 7 Right shift mask 1 one place. If the discarded bit is a one, select the first coordinate given in the coords. column and jump to step 12. If the discarded bit is a zero, continue to step 8.

Step 8 Right shift mask 2 one place. If the discarded bit is a one, select the second coordinate given in the coords. column and jump to step 12. If the discarded bit is a zero, continue to step 9.

Step 9 Right shift mask 3 one place. If the discarded bit is a one, select the third coordinate given in the coords. column and jump to step 12. If the discarded bit is a zero, continue to step 10.

Step 10 Right shift mask 4 one place. If the discarded bit is a one, select the fourth coordinate given in the coords. column and jump to step 12. If the discarded bit is a zero, continue to step 11.

Step 11 Select the fifth coordinate given in the coords. column and continue to step 12.

Step 12 If the selected coordinate is zero, continue to step 13. Otherwise, left shift S one place. If the discarded bit is a one, make the selected coordinate negative.

Step 13 If fewer than 8 coordinates have been produced, return to step 7. Otherwise, encoding is complete.

DETECTION

The detection process consists of converting the 8 coordinates as received into the coordinates of the nearest lattice point. This will be done by creating two candidates, the nearest point with even coordinates and the nearest point with odd coordinates, and then selecting the nearer of these. The following algorithm will perform this:-

Step 1 Initialize: Set X=0, LEER=−1, LOER=−1, ESUM=0, OSUM=0

Step 2 Repeat steps 3 to 11 for each of the 8 coordinates.

Step 3 If the integer part of the coordinate is odd, go to step 8, otherwise continue to step 4.

Step 4 Add 'f', the fractional part of the coordinate to X. Add the integer part of the coordinate to ESUM Add one plus the integer part of the coordinate to OSUM.

Step 5 If f is greater than LEER, replace LEER with f and note this as the 'worst even coordinate'

Step 6 If (1-f) is greater than LOER, replace LOER with (1f) and note this as the 'worst odd coordinate'

Step 7 If all 8 coordinates have been processed, go to step 12. Otherwise return to step 3.

Step 8 Add 1-f to X where f is the fractional part of the coordinate. Add one plus the integer part of the coordinate to ESUM. Add the integer part of the coordinate to OSUM Step 9 If 1-f is not less than LEER, replace LEER with 1-f and note this as the 'worst even coordinate'

Step 10 If f is not less than LOER, replace LOER with f and note this as the 'worst odd coordinate'

Step 11 If all 8 coordinates have been processed, continue to step 12. Otherwise return to step 3.

Step 12 If ESUM=0(mod 4), continue to step 13 otherwise add 2*(1-LEER) to X.

Step 13 If OSUM=0(mod 4), continue to step 14 otherwise subtract 2*(1-LOER) from X.

Step 14 If X<4, go to step 17 to select odd coordinates

Step 15 If ESUM=0(mod 4) go to step 16. Otherwise add two to the integer part of the worst even coordinate if it is even or subtract one if it is odd.

Step 16 Add one to the integer part of each coordinate if it is odd. Go to step 19.

Step 17 If OSUM=0(mod 4) go to step 18. Otherwise add two to the integer part of the worst odd coordinate if it is odd or subtract one if it is even.

Step 18 Add one to the integer part of each coordinate if it is even.

Step 19 The integer parts of the coordinates are now the coordinates of the lattice point closest to the received point.

DECODING

The process of decoding is the inverse of encoding. The 8 coordinates as received and detected must be converted back into the number, N, by means of the following algorithm.

Step 1 Compute the 8 bit quantity, S, as follows: Initially set S=all zeros. Scan the coordinates in reverse sequence and for each positive coordinate, right shift S shifting in a zero. For each negative coordinate, right shift S shifting in a one. For each zero coordinate, leave S unchanged.

Step 2 Replace each coordinate with its absolute value.

Step 3 Compute an 'index' by adding together the index values corresponding to the 8 coordinates as given in the following table:

| Coord. | Index value |
|---|---|
| 0 | 0 |
| 1 | 0 |
| 2 | 1 |
| 3 | 1 |
| 4 | 9 |
| 5 | 9 |
| 6 | 73 |
| 7 | 73 |
| 8 | 376 |
| 9 | 293 |
| 10 | 610 |

Step 4 Scan the even decoding table (table 2a) for even coordinates or the odd decoding table (table 2b) for odd coordinates to find the index computed above. The data in the rest of this entry will be used to control the rest of the decoding process.

Step 5 We now generate the values of the 4 permutation masks, each of 8 bits which were used in the transmitters Steps 6 to 10 are repeated for each of the 8 coordinates scanning the coordinates in reverse sequence. Initially set all 4 mask values to all zeros.

Step 6 If the coordinate is equal to the first coordinate given in the coords. column, left shift mask 1 shifting in a one and jump to step 10. Otherwise left shift mask 1 shifting in a zero and continue to step 7.

Step 7 If the coordinate is equal to the second coordinate given in the coords. column, left shift mask 2 shifting in a one and jump to step 10. Otherwise left shift mask 2 shifting in a zero and continue to step 8.

Step 8 If the coordinate is equal to the third coordinate given in the the coords. column, left shift mask 3 shifting in a one and jump to step 10. Otherwise left shift mask 3 shifting in a zero and continue to step 9.

Step 9 If the coordinate is equal to the fourth coordinate given in the the coords. column, left shift mask 4 shifting in a one. Otherwise left shift mask 4 shifting in a zero.

Step 10 If not all 8 coordinates have been processed, return to step 6. Otherwise continue to step 11.

Step 11 The value of R is now generated from the mask values* using the procedure below corresponding to the value in the perm. type column.

| Perm. type | Procedure |
|---|---|
| 0 | Set R = 0 |
| 1 | Use mask 1 to look up R in table P8. |
| 2 | Use mask 1 to look up R in table P8. |
| 3 | Use mask 1 to look up R in table P8. Add 28 if mask 2 = 00000010 |
| 4 | Use mask 1 to look up R in table P8. |
| 5 | Use mask 1 to look up R in table P8. Add 56 if mask 2 = 00000101 Add 112 if mask 2 = 00000110 |
| 6 | Use mask 1 to look up R in table P8. Add 56 if mask 2 = 00000010 Add 112 if mask 2 = 00000100 Add 168 if mask 3 = 00000010 |
| 7 | Use mask 1 to look up R in table P8. |
| 8 | Use mask 1 to look up R in TABLE P8. Add 70 times the value obtained by using mask 2 to look up in table P8. |
| 9 | Use mask 1 to look up R in table P8. Add 70 times the value obtained by using mask 2 to look up in table P8. |
| 10 | Use mask 1 to look up R in table P8. Add 70 times the value obtained by using mask 2 to look up in table P8. Add 420 if mask 3 = 00000010 |
| 11 | Use mask 1 to look up R in table P8. Add 70 times the value obtained by using mask 2 to look up in table P8. Add 280 times the value obtained by using mask 3 to look up in table P8. Add 840 if mask 4 = 00000010 |
| 12 | Use mask 1 to look up R in table P8. Add 56 times the value obtained by using mask 2 to look up in table P8. |
| 13 | Use mask 1 to look up R in table P8. Add 56 times the value obtained by using mask 2 to look up in table P8. Add 560 if mask 3 = 00000010 |
| 14 | Use mask 1 to look up R in table P8. Add 56 times the value obtained by using mask 2 to look up in table P8. Add 560 if mask 3 = 00000101 Add 1120 if mask 3 = 00000110 |
| 15 | Use mask 1 to look up R in table P8. Add 56 times the value obtained by using mask 2 to look up in table P8. Add 560 times the value obtained by using mask 3 to look up in table P8. Add 1680 if mask 4 = 00000010 |
| 17 | Use mask 1 to look up R in table P8. Add 28 times the value obtained by using mask 2 to look up in table P8. Add 420 times the value obtained by using mask 3 to look up in table P8. |
| 18 | Use mask 1 to look up R in table P8. Add 28 times the value obtained by using mask 2 to look up in table P8. Add 420 times the value obtained by using mask 3 to look up in table P8. |

*The phrase "use Mask" in the "Procedure" steps which follow is an abbreviation for "use Mask value".

Step 12 Compute D by multiplying R by 2**B where B is the value in the Sign bits column and add the value of the high order B bits of S.

Step 13 Add the value in the offset column to D to give the value of N.

TABLE 1

Main Encode Table

| Offset | Sign bits | Perm. type | Coord. type | Sign parity | Coords. |
|---|---|---|---|---|---|
| 0 | 7 | 0 | ODD | EVEN | 1 |
| 128 | 4 | 7 | EVEN | — | 2,0 |
| 1,248 | 7 | 1 | ODD | ODD | 1,3 |
| 2,272 | 6 | 2 | EVEN | — | 2,0 |
| 4,064 | 7 | 2 | ODD | EVEN | 1,3 |
| 7,648 | 3 | 5 | EVEN | — | 0,2,4 |
| 8,992 | 8 | 0 | EVEN | — | 2 |
| 9,248 | 7 | 4 | ODD | ODD | 1,3 |
| 16,416 | 5 | 8 | EVEN | — | 2,0,4 |
| 25,376 | 7 | 1 | ODD | EVEN | 1,5 |
| 26,400 | 7 | 7 | ODD | EVEN | 3,1 |
| 35,360 | 7 | 3 | EVEN | — | 2,4,0 |
| 42,528 | 4 | 9 | EVEN | — | 0,4,2 |
| 49,248 | 7 | 3 | ODD | ODD | 1,5,3 |
| 56,416 | 7 | 4 | ODD | ODD | 3,1 |
| 63,584 | 6 | 9 | EVEN | — | 2,4,0 |
| 90,464 | 3 | 4 | EVEN | — | 0,4 |
| 90,912 | 7 | 5 | ODD | EVEN | 1,3,5 |
| 112,416 | 4 | 8 | EVEN | — | 0,2,6 |
| 116,896 | 7 | 2 | ODD | EVEN | 3,1 |
| 120,480 | 8 | 2 | EVEN | — | 2,4 |
| 127,648 | 5 | 12 | EVEN | — | 4,0,2 |
| 145,568 | 7 | 8 | ODD | ODD | 1,3,5 |
| 181,408 | 7 | 2 | ODD | EVEN | 1,5 |
| 184,992 | 6 | 5 | EVEN | — | 2,0,6 |
| 195,744 | 3 | 6 | EVEN | — | 0,6,4,2 |
| 198,432 | 7 | 1 | ODD | ODD | 1,7 |

TABLE 1-continued

Main Encode Table

| Offset | Sign bits | Perm. type | Coord. type | Sign parity | Coords. |
|---|---|---|---|---|---|
| 199,456 | 7 | 1 | ODD | ODD | 3,1 |
| 200,480 | 7 | 8 | EVEN | — | 2,4,0 |
| 236,320 | 4 | 7 | EVEN | — | 4,0 |
| 237,440 | 8 | 1 | EVEN | — | 2,6 |
| 239,488 | 5 | 13 | EVEN | — | 2,0,6,4 |
| 275,328 | 7 | 8 | ODD | EVEN | 3,1,5 |
| 311,168 | 7 | 5 | ODD | ODD | 1,5,3 |
| 332,672 | 7 | 3 | ODD | EVEN | 1,7,3 |
| 339,840 | 7 | 0 | ODD | EVEN | 3 |
| 339,968 | 6 | 9 | EVEN | — | 4,2,0 |
| 366,848 | 7 | 5 | ODD | ODD | 3,1,5 |
| 388,352 | 7 | 9 | ODD | EVEN | 1,5,3 |
| 442,112 | 7 | 6 | EVEN | — | 2,6,4,0 |
| 485,120 | 4 | 10 | EVEN | — | 0,4,6,2 |
| 498,560 | 7 | 5 | ODD | ODD | 1,3,7 |
| 520,064 | 3 | 5 | EVEN | — | 0,2,8 |
| 521,408 | 8 | 7 | EVEN | — | 4,2 |
| 539,328 | 5 | 4 | EVEN | — | 4,0 |
| 541,120 | 7 | 3 | ODD | EVEN | 3,5,1 |
| 548,288 | 7 | 12 | ODD | ODD | 3,1,5 |
| 619,968 | 7 | 4 | ODD | EVEN | 1,5 |
| 627,136 | 6 | 14 | EVEN | — | 2,4,0,6 |
| 734,656 | 4 | 9 | EVEN | — | 0,6,2 |
| 741,376 | 7 | 8 | ODD | EVEN | 1,3,7 |
| 777,216 | 7 | 3 | ODD | ODD | 1,7,5 |
| 784,384 | 5 | 8 | EVEN | — | 2,0,8 |
| 793,344 | 7 | 5 | EVEN | — | 4,2,0 |
| 814,848 | 7 | 1 | ODD | ODD | 3,5 |
| 815,872 | 7 | 9 | ODD | EVEN | 3,5,1 |
| 869,632 | 7 | 8 | ODD | ODD | 1,5,3 |
| 905,472 | 8 | 5 | EVEN | — | 2,4,6 |
| 948,480 | 5 | 13 | EVEN | — | 4,0,6,2 |
| 984,320 | 6 | 9 | EVEN | — | 2,6,0 |
| 1,011,200 | 3 | 5 | EVEN | — | 0,6,4 |
| 1,012,544 | 7 | 8 | ODD | ODD | 3,1,7 |
| 1,048,384 | 7 | 6 | ODD | EVEN | 1,7,5,3 |
| 1,091,392 | 7 | 3 | EVEN | — | 2,8,0 |
| 1,098,560 | 4 | 10 | EVEN | — | 0,2,8,4 |
| 1,112,000 | 7 | 1 | ODD | EVEN | 1,9 |
| 1,113,024 | 6 | 2 | EVEN | — | 4,0 |
| 1,114,816 | 7 | 5 | ODD | ODD | 3,5,1 |
| 1,136,320 | 7 | 12 | ODD | EVEN | 5,1,3 |
| 1,208,000 | 7 | 13 | EVEN | — | 4,2,6,0 |
| 1,351,360 | 8 | 2 | EVEN | — | 2,6 |
| 1,358,528 | 5 | 14 | EVEN | — | 0,6,2,4 |
| 1,412,288 | 7 | 5 | ODD | EVEN | 3,1,7 |
| 1,433,792 | 7 | 10 | ODD | ODD | 1,3,7,5 |
| 1,541,312 | 6 | 10 | EVEN | — | 2,0,8,4 |
| 1,595,072 | 3 | 5 | EVEN | — | 0,4,8 |
| 1,596,416 | 7 | 3 | ODD | ODD | 1,9,3 |
| 1,603,584 | 8 | 2 | EVEN | — | 4,2 |
| 1,610,752 | 7 | 2 | ODD | EVEN | 3,5 |
| 1,614,336 | 7 | 12 | ODD | ODD | 5,3,1 |
| 1,686,016 | 7 | 7 | ODD | EVEN | 5,1 |
| 1,694,976 | 6 | 10 | EVEN | — | 4,0,6,2 |
| 1,748,736 | 7 | 10 | EVEN | — | 2,6,4,0 |
| 1,856,256 | 4 | 9 | EVEN | — | 0,6,4 |
| 1,862,976 | 7 | 3 | ODD | ODD | 3,7,1 |
| 1,870,144 | 7 | 13 | ODD | EVEN | 3,1,7,5 |
| 2,013,504 | 7 | 5 | ODD | ODD | 1,5,7 |
| 2,035,008 | 7 | 2 | ODD | EVEN | 1,7 |
| 2,038,592 | 8 | 3 | EVEN | — | 2,8,4 |
| 2,052,928 | 5 | 14 | EVEN | — | 0,4,2,8 |
| 2,106,688 | 3 | 6 | EVEN | — | 0,8,6,2 |
| 2,109,376 | 7 | 5 | ODD | EVEN | 1,3,9 |
| 2,130,880 | 7 | 1 | EVEN | — | 4,0 |
| 2,131,904 | 7 | 8 | ODD | EVEN | 3,5,1 |
| 2,167,744 | 7 | 8 | ODD | ODD | 5,1,3 |
| 2,203,584 | 8 | 8 | EVEN | — | 4,2,6 |
| 2,275,264 | 6 | 17 | EVEN | — | 6,4,2,0 |
| 2,436,544 | 4 | 8 | EVEN | — | 0,6,2 |
| 2,441,024 | 7 | 1 | ODD | EVEN | 3,7 |
| 2,442,048 | 7 | 10 | ODD | ODD | 3,1,7,5 |
| 2,549,568 | 7 | 10 | ODD | EVEN | 1,5,7,3 |
| 2,657,088 | 7 | 5 | ODD | ODD | 1,7,3 |
| 2,678,592 | 7 | 10 | EVEN | — | 2,4,8,0 |
| 2,786,112 | 4 | 8 | EVEN | — | 0,4,8 |
| 2,790,592 | 5 | 13 | EVEN | — | 2,0,8,6 |
| 2,826,432 | 7 | 8 | ODD | ODD | 1,3,9 |
| 2,862,272 | 7 | 3 | ODD | EVEN | 1,9,5 |
| 2,869,440 | 4 | 8 | EVEN | — | 0,2,10 |
| 2,873,920 | 7 | 4 | ODD | ODD | 3,5 |
| 2,881,088 | 7 | 9 | ODD | EVEN | 5,3,1 |
| 2,934,848 | 7 | 6 | EVEN | — | 4,6,2,0 |
| 2,977,856 | 8 | 9 | EVEN | — | 2,6,4 |
| 3,085,376 | 5 | 12 | EVEN | — | 4,0,6 |
| 3,103,296 | 6 | 12 | EVEN | — | 6,2,0 |
| 3,139,136 | 7 | 6 | ODD | EVEN | 3,7,5,1 |
| 3,182,144 | 7 | 14 | ODD | ODD | 1,5,3,7 |
| 3,397,184 | 7 | 9 | ODD | EVEN | 1,7,3 |
| 3,450,944 | 6 | 14 | EVEN | — | 4,2,0,8 |
| 3,558,464 | 7 | 6 | EVEN | — | 2,8,6,0 |
| 3,601,472 | 4 | 11 | EVEN | — | 0,8,6,4,2 |
| 3,628,352 | 7 | 8 | ODD | EVEN | 3,1,9 |
| 3,664,192 | 7 | 6 | ODD | ODD | 1,9,5,3 |
| 3,707,200 | 6 | 5 | EVEN | — | 2,0,10 |
| 3,717,952 | 3 | 6 | EVEN | — | 0,10,4,2 |
| 3,720,640 | 8 | 0 | EVEN | — | 4 |
| 3,720,896 | 7 | 8 | ODD | ODD | 5,3,1 |
| 3,756,736 | 7 | 4 | ODD | EVEN | 5,1 |
| 3,763,904 | 7 | 14 | EVEN | — | 4,6,2,0 |
| 3,978,944 | 8 | 4 | EVEN | — | 2,6 |
| 3,993,280 | 5 | 13 | EVEN | — | 6,0,4,2 |
| 4,029,120 | 7 | 3 | ODD | ODD | 3,7,5 |
| 4,036,288 | 7 | 14 | ODD | EVEN | 3,5,1,7 |
| 4,251,328 | 7 | 8 | ODD | ODD | 1,5,7 |
| 4,287,168 | 7 | 12 | ODD | ODD | 3,1,7 |
| 4,358,848 | 7 | 5 | ODD | EVEN | 1,7,5 |
| 4,380,352 | 8 | 8 | EVEN | — | 2,4,8 |
| 4,452,032 | 5 | 8 | EVEN | — | 4,0,8 |
| 4,460,992 | 6 | 15 | EVEN | — | 2,0,8,6,4 |
| 4,676,032 | 7 | 5 | ODD | ODD | 3,1,9 |
| 4,697,536 | 7 | 10 | ODD | EVEN | 1,3,9,5 |
| 4,805,056 | 8 | 1 | EVEN | — | 2,10 |
| 4,807,104 | 5 | 13 | EVEN | — | 2,0,10,4 |
| 4,842,944 | 7 | 7 | ODD | EVEN | 5,3 |
| 4,851,904 | 7 | 5 | ODD | ODD | 5,1,3 |
| 4,873,408 | 8 | 3 | EVEN | — | 4,6,2 |
| 4,887,744 | 6 | 9 | EVEN | — | 4,6,0 |
| 4,914,624 | 7 | 13 | EVEN | — | 6,2,4,0 |
| 5,057,984 | 7 | 10 | ODD | ODD | 3,5,7,1 |
| 5,165,504 | 7 | 13 | ODD | EVEN | 5,1,7,3 |
| 5,308,864 | 7 | 9 | ODD | EVEN | 3,7,1 |
| 5,362,624 | 7 | 10 | ODD | ODD | 1,7,5,3 |
| 5,470,144 | 7 | 10 | EVEN | — | 4,2,8,0 |
| 5,577,664 | 8 | 6 | EVEN | — | 2,8,6,4 |
| 5,663,680 | 5 | 15 | EVEN | — | 0,4,8,6,2 |
| 5,771,200 | 3 | 5 | EVEN | — | 0,6,8 |
| 5,772,544 | 7 | 3 | ODD | EVEN | 3,9,1 |
| 5,779,712 | 7 | 13 | ODD | ODD | 3,1,9,5 |
| 5,923,072 | 7 | 5 | ODD | EVEN | 1,5,9 |
| 5,944,576 | 7 | 6 | EVEN | — | 2,10,4,0 |
| 5,987,584 | 4 | 10 | EVEN | — | 0,4,10,2 |
| 6,001,024 | 7 | 5 | ODD | EVEN | 5,3,1 |
| 6,022,528 | 8 | 9 | EVEN | — | 4,6,2 |
| 6,130,048 | 6 | 14 | EVEN | — | 6,4,0,2 |
| 6,237,568 | 4 | 7 | EVEN | — | 6,0 |
| 6,238,688 | 7 | 5 | ODD | EVEN | 3,5,7 |
| 6,260,192 | 7 | 14 | ODD | ODD | 5,3,1,7 |
| 6,475,232 | 7 | 5 | ODD | ODD | 3,7,1 |
| 6,496,736 | 7 | 14 | ODD | EVEN | 1,7,3,5 |
| 6,711,776 | 6 | 5 | EVEN | — | 4,0,8 |
| 6,722,528 | 7 | 15 | EVEN | — | 2,4,8,6,0 |
| 7,152,608 | 5 | 14 | EVEN | — | 0,6,2,8 |
| 7,206,368 | 7 | 1 | ODD | ODD | 3,9 |
| 7,207,392 | 7 | 10 | ODD | EVEN | 3,1,9,5 |
| 7,314,912 | 7 | 10 | ODD | ODD | 1,5,9,3 |
| 7,422,432 | 6 | 14 | EVEN | — | 2,4,0,10 |
| 7,529,952 | 7 | 4 | ODD | ODD | 5,3 |
| 7,537,120 | 7 | 2 | ODD | EVEN | 5,1 |
| 7,540,704 | 7 | 5 | EVEN | — | 4,6,0 |
| 7,562,208 | 8 | 12 | EVEN | — | 6,2,4 |
| 7,705,568 | 6 | 9 | EVEN | — | 6,2,0 |
| 7,732,448 | 7 | 13 | ODD | EVEN | 5,3,7,1 |
| 7,875,808 | 7 | 8 | ODD | ODD | 5,1,7 |
| 7,911,648 | 7 | 2 | ODD | EVEN | 3,7 |

TABLE 1-continued

Main Encode Table

| Offset | Sign bits | Perm. type | Coord. type | Sign parity | Coords. |
|---|---|---|---|---|---|
| 7,915,232 | 7 | 14 | ODD | ODD | 3,7,1,5 |
| 8,130,272 | 7 | 9 | ODD | EVEN | 1,7,5 |
| 8,184,032 | 7 | 4 | ODD | ODD | 1,7 |
| 8,191,200 | 8 | 5 | EVEN | — | 4,2,8 |
| 8,234,208 | 6 | 15 | EVEN | — | 4,0,8,6,2 |
| 8,449,248 | 7 | 10 | EVEN | — | 2,6,8,0 |
| 8,556,768 | 4 | 10 | EVEN | — | 0,6,8,4 |
| 8,570,208 | 7 | 6 | ODD | ODD | 3,9,5,1 |
| 8,613,216 | 7 | 14 | ODD | EVEN | 1,5,3,9 |
| 8,828,256 | 8 | 5 | EVEN | — | 2,4,10 |
| 8,871,264 | 5 | 13 | EVEN | — | 4,0,10,2 |
| 8,907,104 | 7 | 3 | ODD | ODD | 5,3,1 |
| 8,914,272 | 7 | 13 | EVEN | — | 6,4,2,0 |
| 9,057,632 | 8 | 7 | EVEN | — | 6,2 |
| 9,075,552 | 5 | 8 | EVEN | — | 6,0,4 |
| 9,084,512 | 7 | 8 | ODD | ODD | 3,5,7 |
| 9,120,352 | 7 | 10 | ODD | EVEN | 5,1,7,3 |
| 9,227,872 | 7 | 10 | ODD | EVEN | 3,7,5,1 |
| 9,335,392 | 7 | 14 | ODD | ODD | 1,7,5,3 |
| 9,550,432 | 7 | 8 | ODD | EVEN | 1,7,3 |
| 9,586,272 | 7 | 3 | EVEN | — | 4,8,0 |
| 9,593,440 | 8 | 13 | EVEN | — | 4,2,8,6 |
| 9,880,160 | 6 | 18 | EVEN | — | 6,2,0,8,4 |
| 10,202,720 | 7 | 3 | ODD | EVEN | 3,9,5 |
| 10,209,888 | 7 | 14 | ODD | ODD | 3,5,1,9 |
| 10,424,928 | 7 | 8 | ODD | EVEN | 1,5,9 |
| 10,460,768 | 7 | 13 | EVEN | — | 4,2,10,0 |
| 10,604,128 | 7 | 2 | ODD | EVEN | 5,3 |
| 10,607,712 | 8 | 2 | EVEN | — | 4,6 |
| 10,614,880 | 7 | 10 | EVEN | — | 6,2,4,0 |
| 10,722,400 | 7 | 10 | ODD | ODD | 5,3,7,1 |
| 10,829,920 | 7 | 5 | ODD | ODD | 3,7,5 |
| 10,851,424 | 7 | 17 | ODD | EVEN | 7,5,3,1 |
| 11,173,984 | 7 | 12 | ODD | ODD | 7,1,3 |
| 11,245,664 | 7 | 11 | EVEN | — | 4,8,6,2,0 |
| 11,460,704 | 8 | 10 | EVEN | — | 2,6,8,4 |
| 11,675,744 | 5 | 14 | EVEN | — | 0,6,4,8 |
| 11,729,504 | 7 | 10 | ODD | EVEN | 3,5,9,1 |
| 11,837,024 | 7 | 13 | ODD | ODD | 5,1,9,3 |
| 11,980,384 | 6 | 10 | EVEN | — | 4,0,10,2 |
| 12,034,144 | 7 | 1 | ODD | EVEN | 5,1 |
| 12,035,168 | 8 | 8 | EVEN | — | 4,6,2 |
| 12,106,848 | 6 | 9 | EVEN | — | 6,4,0 |
| 12,133,728 | 7 | 8 | ODD | EVEN | 5,3,7 |
| 12,169,568 | 7 | 5 | ODD | ODD | 5,1,7 |
| 12,191,072 | 7 | 14 | ODD | ODD | 3,7,5,1 |
| 12,406,112 | 7 | 12 | ODD | EVEN | 5,1,7 |
| 12,477,792 | 7 | 12 | ODD | EVEN | 7,3,1 |
| 12,549,472 | 7 | 8 | ODD | ODD | 1,7,5 |
| 12,585,312 | 8 | 1 | EVEN | — | 4,8 |
| 12,587,360 | 7 | 18 | EVEN | — | 6,4,2,8,0 |
| 13,232,480 | 5 | 13 | EVEN | — | 6,0,8,2 |
| 13,268,320 | 7 | 5 | ODD | ODD | 3,5,9 |
| 13,289,824 | 7 | 14 | ODD | EVEN | 5,3,1,9 |
| 13,504,864 | 8 | 8 | EVEN | — | 4,2,10 |
| 13,576,544 | 7 | 1 | ODD | ODD | 5,3 |
| 13,577,568 | 8 | 9 | EVEN | — | 6,4,2 |
| 13,685,088 | 6 | 5 | EVEN | — | 6,0,2 |
| 13,695,840 | 7 | 6 | ODD | EVEN | 5,7,3,1 |
| 13,738,848 | 7 | 9 | ODD | EVEN | 3,7,5 |
| 13,792,608 | 7 | 14 | ODD | ODD | 5,7,1,3 |
| 14,007,648 | 7 | 8 | ODD | ODD | 3,7,1 |
| 14,043,488 | 7 | 13 | ODD | EVEN | 7,1,5,3 |
| 14,186,848 | 8 | 6 | EVEN | — | 4,8,6,2 |
| 14,272,864 | 6 | 14 | EVEN | — | 4,6,0,8 |
| 14,380,384 | 7 | 13 | EVEN | — | 6,2,8,0 |
| 14,523,744 | 7 | 13 | ODD | ODD | 5,3,9,1 |
| 14,667,104 | 7 | 8 | ODD | EVEN | 5,1,9 |
| 14,702,944 | 7 | 6 | EVEN | — | 4,10,2,0 |
| 14,745,952 | 7 | 8 | EVEN | — | 6,4,0 |
| 14,781,792 | 8 | 4 | EVEN | — | 6,2 |
| 14,796,128 | 7 | 5 | ODD | ODD | 5,3,7 |
| 14,817,632 | 7 | 14 | ODD | EVEN | 5,7,3,1 |
| 15,032,672 | 7 | 4 | ODD | EVEN | 3,7 |
| 15,039,840 | 7 | 14 | ODD | ODD | 7,3,1,5 |
| 15,254,880 | 8 | 14 | EVEN | — | 4,6,2,8 |
| 15,684,960 | 6 | 15 | EVEN | — | 6,0,8,4,2 |
| 15,900,000 | 7 | 8 | ODD | EVEN | 3,5,9 |
| 15,935,840 | 7 | 10 | ODD | ODD | 5,1,9,3 |
| 16,043,360 | 7 | 0 | ODD | EVEN | 5 |
| 16,043,488 | 7 | 6 | EVEN | — | 6,4,2,0 |
| 16,086,496 | 7 | 3 | ODD | ODD | 5,7,1 |
| 16,093,664 | 7 | 12 | ODD | ODD | 5,3,7 |
| 16,165,344 | 7 | 9 | ODD | EVEN | 5,7,1 |
| 16,219,104 | 7 | 13 | ODD | EVEN | 7,3,5,1 |
| 16,362,464 | 7 | 12 | ODD | ODD | 7,1,5 |
| 16,434,144 | 7 | 7 | ODD | EVEN | 7,1 |
| 16,443,104 | 7 | 10 | EVEN | — | 4,6,8,0 |
| 16,550,624 | 8 | 13 | EVEN | — | 6,2,8,4 |

TABLE 2a

Even Decode Table

| Index | Offset | Sign bits | Perm. type | Coords. |
|---|---|---|---|---|
| 4 | 128 | 4 | 7 | 2,0 |
| 6 | 2,272 | 6 | 2 | 2,0 |
| 8 | 8,992 | 8 | 0 | 2 |
| 11 | 7,648 | 3 | 5 | 0,2,4 |
| 13 | 16,416 | 5 | 8 | 2,0,4 |
| 15 | 35,360 | 7 | 3 | 2,4,0 |
| 20 | 42,528 | 4 | 9 | 0,4,2 |
| 22 | 63,584 | 6 | 9 | 2,4,0 |
| 24 | 120,480 | 8 | 2 | 2,4 |
| 27 | 90,464 | 3 | 4 | 0,4 |
| 29 | 127,648 | 5 | 12 | 4,0,2 |
| 31 | 200,480 | 7 | 8 | 2,4,0 |
| 36 | 236,320 | 4 | 7 | 4,0 |
| 38 | 339,968 | 6 | 9 | 4,2,0 |
| 40 | 521,408 | 8 | 7 | 4,2 |
| 45 | 539,328 | 5 | 4 | 4,0 |
| 47 | 793,344 | 7 | 5 | 4,2,0 |
| 54 | 1,113,024 | 6 | 2 | 4,0 |
| 56 | 1,603,584 | 8 | 2 | 4,2 |
| 63 | 2,130,880 | 7 | 1 | 4,0 |
| 72 | 3,720,640 | 8 | 0 | 4 |
| 76 | 112,416 | 4 | 8 | 0,2,6 |
| 78 | 184,992 | 6 | 5 | 2,0,6 |
| 80 | 237,440 | 8 | 1 | 2,6 |
| 83 | 195,744 | 3 | 6 | 0,6,4,2 |
| 85 | 239,488 | 5 | 13 | 2,0,6,4 |
| 87 | 442,112 | 7 | 6 | 2,6,4,0 |
| 92 | 485,120 | 4 | 10 | 0,4,6,2 |
| 94 | 627,136 | 6 | 14 | 2,4,0,6 |
| 96 | 905,472 | 8 | 5 | 2,4,6 |
| 101 | 948,480 | 5 | 13 | 4,0,6,2 |
| 103 | 1,208,000 | 7 | 13 | 4,2,6,0 |
| 110 | 1,694,976 | 6 | 10 | 4,0,6,2 |
| 112 | 2,203,584 | 8 | 8 | 4,2,6 |
| 119 | 2,934,848 | 7 | 6 | 4,6,2,0 |
| 128 | 4,873,408 | 8 | 3 | 4,6,2 |
| 148 | 734,656 | 4 | 9 | 0,6,2 |
| 150 | 984,320 | 6 | 9 | 2,6,0 |
| 152 | 1,351,360 | 8 | 2 | 2,6 |
| 155 | 1,011,200 | 3 | 5 | 0,6,4 |
| 157 | 1,358,528 | 5 | 14 | 0,6,2,4 |
| 159 | 1,748,736 | 7 | 10 | 2,6,4,0 |
| 164 | 1,856,256 | 4 | 9 | 0,6,4 |
| 166 | 2,275,264 | 6 | 17 | 6,4,2,0 |
| 168 | 2,977,856 | 8 | 9 | 2,6,4 |
| 173 | 3,085,376 | 5 | 12 | 4,0,6 |
| 175 | 3,763,904 | 7 | 14 | 4,6,2,0 |
| 182 | 4,887,744 | 6 | 9 | 4,6,0 |
| 184 | 6,022,528 | 8 | 9 | 4,6,2 |
| 191 | 7,540,704 | 7 | 5 | 4,6,0 |
| 200 | 10,607,712 | 8 | 2 | 4,6 |
| 220 | 2,436,544 | 4 | 8 | 0,6,2 |
| 222 | 3,103,296 | 6 | 12 | 6,2,0 |
| 224 | 3,978,944 | 8 | 4 | 2,6 |
| 229 | 3,993,280 | 5 | 13 | 6,0,4,2 |
| 231 | 4,914,624 | 7 | 13 | 6,2,4,0 |
| 238 | 6,130,048 | 6 | 14 | 6,4,0,2 |
| 240 | 7,562,208 | 8 | 12 | 6,2,4 |
| 247 | 8,914,272 | 7 | 13 | 6,4,2,0 |
| 256 | 12,035,168 | 8 | 8 | 4,6,2 |

TABLE 2a-continued

Even Decode Table

| Index | Offset | Sign bits | Perm. type | Coords. |
|---|---|---|---|---|
| 292 | 6,237,568 | 4 | 7 | 6,0 |
| 294 | 7,705,568 | 6 | 9 | 6,2,0 |
| 296 | 9,057,632 | 8 | 7 | 6,2 |
| 301 | 9,075,552 | 5 | 8 | 6,0,4 |
| 303 | 10,614,880 | 7 | 10 | 6,2,4,0 |
| 310 | 12,106,848 | 6 | 9 | 6,4,0 |
| 312 | 13,577,568 | 8 | 9 | 6,4,2 |
| 319 | 14,745,952 | 7 | 8 | 6,4,0 |
| 366 | 13,685,088 | 6 | 5 | 6,0,2 |
| 368 | 14,781,792 | 8 | 4 | 6,2 |
| 375 | 16,043,488 | 7 | 6 | 6,4,2,0 |
| 378 | 520,064 | 3 | 5 | 0,2,8 |
| 380 | 784,384 | 5 | 8 | 2,0,8 |
| 382 | 1,091,392 | 7 | 3 | 2,8,0 |
| 387 | 1,098,560 | 4 | 10 | 0,2,8,4 |
| 389 | 1,541,312 | 6 | 10 | 2,0,8,4 |
| 391 | 2,038,592 | 8 | 3 | 2,8,4 |
| 394 | 1,595,072 | 3 | 5 | 0,4,8 |
| 396 | 2,052,928 | 5 | 14 | 0,4,2,8 |
| 398 | 2,678,592 | 7 | 10 | 2,4,8,0 |
| 403 | 2,786,112 | 4 | 8 | 0,4,8 |
| 405 | 3,450,944 | 6 | 14 | 4,2,0,8 |
| 407 | 4,380,352 | 8 | 8 | 2,4,8 |
| 412 | 4,452,032 | 5 | 8 | 4,0,8 |
| 414 | 5,470,144 | 7 | 10 | 4,2,8,0 |
| 421 | 6,711,776 | 6 | 5 | 4,0,8 |
| 423 | 8,191,200 | 8 | 5 | 4,2,8 |
| 430 | 9,586,272 | 7 | 3 | 4,8,0 |
| 439 | 2,585,312 | 8 | 1 | 4,8 |
| 450 | 2,106,688 | 3 | 6 | 0,8,6,2 |
| 452 | 2,790,592 | 5 | 13 | 2,0,8,6 |
| 454 | 3,558,464 | 7 | 6 | 2,8,6,0 |
| 459 | 3,601,472 | 4 | 11 | 0,8,6,4,2 |
| 461 | 4,460,992 | 6 | 15 | 2,0,8,6,4 |
| 463 | 5,577,664 | 8 | 6 | 2,8,6,4 |
| 468 | 5,663,680 | 5 | 15 | 0,4,8,6,2 |
| 470 | 6,722,528 | 7 | 15 | 2,4,8,6,0 |
| 477 | 8,234,208 | 6 | 15 | 4,0,8,6,2 |
| 479 | 9,593,440 | 8 | 13 | 4,2,8,6 |
| 486 | 11,245,664 | 7 | 11 | 4,8,6,2,0 |
| 495 | 14,186,848 | 8 | 6 | 4,8,6,2 |
| 522 | 5,771,200 | 3 | 5 | 0,6,8 |
| 524 | 7,152,608 | 5 | 14 | 0,6,2,8 |
| 526 | 8,449,248 | 7 | 10 | 2,6,8,0 |
| 531 | 8,556,768 | 4 | 10 | 0,6,8,4 |
| 533 | 9,880,160 | 6 | 18 | 6,2,0,8,4 |
| 535 | 11,460,704 | 8 | 10 | 2,6,8,4 |
| 540 | 11,675,744 | 5 | 14 | 0,6,4,8 |
| 542 | 12,587,360 | 7 | 18 | 6,4,2,8,0 |
| 549 | 14,272,864 | 6 | 14 | 4,6,0,8 |
| 551 | 15,254,880 | 8 | 14 | 4,6,2,8 |
| 558 | 16,443,104 | 7 | 10 | 4,6,8,0 |
| 596 | 13,232,480 | 5 | 13 | 6,0,8,2 |
| 598 | 14,380,384 | 7 | 13 | 6,2,8,0 |
| 605 | 15,684,960 | 6 | 15 | 6,0,8,4,2 |
| 607 | 16,550,624 | 8 | 13 | 6,2,8,4 |
| 613 | 2,869,440 | 4 | 8 | 0,2,10 |
| 615 | 3,707,200 | 6 | 5 | 2,0,10 |
| 617 | 4,805,056 | 8 | 1 | 2,10 |
| 620 | 3,717,952 | 3 | 6 | 0,10,4,2 |
| 622 | 4,807,104 | 5 | 13 | 2,0,10,4 |
| 624 | 5,944,576 | 7 | 6 | 2,10,4,0 |
| 629 | 5,987,584 | 4 | 10 | 0,4,10,2 |
| 631 | 7,422,432 | 6 | 14 | 2,4,0,10 |
| 633 | 8,828,256 | 8 | 5 | 2,4,10 |
| 638 | 8,871,264 | 5 | 13 | 4,0,10,2 |
| 640 | 10,460,768 | 7 | 13 | 4,2,10,0 |
| 647 | 11,980,384 | 6 | 10 | 4,0,10,2 |
| 649 | 13,504,864 | 8 | 8 | 4,2,10 |
| 656 | 14,702,944 | 7 | 6 | 4,10,2,0 |

TABLE 2b

Odd Decode Table

| Index | Offset | Sign bits | Perm. type | Coords. |
|---|---|---|---|---|
| 0 | 0 | 7 | 0 | 1 |
| 1 | 1,248 | 7 | 1 | 1,3 |
| 2 | 4,064 | 7 | 1 | 1,3 |
| 3 | 9,248 | 7 | 4 | 1,3 |
| 4 | 26,400 | 7 | 7 | 3,1 |
| 5 | 56,416 | 7 | 4 | 3,1 |
| 6 | 116,896 | 7 | 1 | 3,1 |
| 7 | 199,456 | 7 | 1 | 3,1 |
| 8 | 339,840 | 7 | 0 | 3 |
| 9 | 25,376 | 7 | 1 | 1,5 |
| 10 | 49,248 | 7 | 3 | 1,5,3 |
| 11 | 90,912 | 7 | 5 | 1,3,5 |
| 12 | 145,568 | 7 | 8 | 1,3,5 |
| 13 | 275,328 | 7 | 8 | 3,1,5 |
| 14 | 366,848 | 7 | 5 | 3,1,5 |
| 15 | 541,120 | 7 | 3 | 3,5,1 |
| 16 | 814,848 | 7 | 1 | 3,5 |
| 18 | 181,408 | 7 | 1 | 1,5 |
| 19 | 311,168 | 7 | 5 | 1,5,3 |
| 20 | 388,352 | 7 | 9 | 1,5,3 |
| 21 | 548,288 | 7 | 12 | 3,1,5 |
| 22 | 815,872 | 7 | 9 | 3,5,1 |
| 23 | 1,114,816 | 7 | 5 | 3,5,1 |
| 24 | 1,610,752 | 7 | 1 | 3,5 |
| 27 | 619,968 | 7 | 4 | 1,5 |
| 28 | 869,632 | 7 | 8 | 1,5,3 |
| 29 | 1,136,320 | 7 | 12 | 5,1,3 |
| 30 | 1,614,336 | 7 | 12 | 5,3,1 |
| 31 | 2,131,904 | 7 | 8 | 3,5,1 |
| 32 | 2,873,920 | 7 | 4 | 3,5 |
| 36 | 1,686,016 | 7 | 7 | 5,1 |
| 37 | 2,167,744 | 7 | 8 | 5,1,3 |
| 38 | 2,881,088 | 7 | 9 | 5,3,1 |
| 39 | 3,720,896 | 7 | 8 | 5,3,1 |
| 40 | 4,842,944 | 7 | 7 | 5,3 |
| 45 | 3,756,736 | 7 | 4 | 5,1 |
| 46 | 4,851,904 | 7 | 5 | 5,1,3 |
| 47 | 6,001,024 | 7 | 5 | 5,3,1 |
| 48 | 7,529,952 | 7 | 4 | 5,3 |
| 54 | 7,537,120 | 7 | 1 | 5,1 |
| 55 | 8,907,104 | 7 | 3 | 5,3,1 |
| 56 | 10,604,128 | 7 | 1 | 5,3 |
| 63 | 12,034,144 | 7 | 1 | 5,1 |
| 64 | 13,576,544 | 7 | 1 | 5,3 |
| 72 | 16,043,360 | 7 | 0 | 5 |
| 73 | 198,432 | 7 | 1 | 1,7 |
| 74 | 332,672 | 7 | 3 | 1,7,3 |
| 75 | 498,560 | 7 | 5 | 1,3,7 |
| 76 | 741,376 | 7 | 8 | 1,3,7 |
| 77 | 1,012,544 | 7 | 8 | 3,1,7 |
| 78 | 1,412,288 | 7 | 5 | 3,1,7 |
| 79 | 1,862,976 | 7 | 3 | 3,7,1 |
| 80 | 2,441,024 | 7 | 1 | 3,7 |
| 82 | 777,216 | 7 | 3 | 1,7,5 |
| 83 | 1,048,384 | 7 | 6 | 1,7,5,3 |
| 84 | 1,433,792 | 7 | 10 | 1,3,7,5 |
| 85 | 1,870,144 | 7 | 13 | 3,1,7,5 |
| 86 | 2,442,048 | 7 | 10 | 3,1,7,5 |
| 87 | 3,139,136 | 7 | 6 | 3,7,5,1 |
| 88 | 4,029,120 | 7 | 3 | 3,7,5 |
| 91 | 2,013,504 | 7 | 5 | 1,5,7 |
| 92 | 2,549,568 | 7 | 10 | 1,5,7,3 |
| 93 | 3,182,144 | 7 | 14 | 1,5,3,7 |
| 94 | 4,036,288 | 7 | 14 | 3,5,1,7 |
| 95 | 5,057,984 | 7 | 10 | 3,5,7,1 |
| 96 | 6,238,688 | 7 | 5 | 3,5,7 |
| 100 | 4,251,328 | 7 | 8 | 1,5,7 |
| 101 | 5,165,504 | 7 | 13 | 5,1,7,3 |
| 102 | 6,260,192 | 7 | 14 | 5,3,1,7 |
| 103 | 7,732,448 | 7 | 13 | 5,3,7,1 |
| 104 | 9,084,512 | 7 | 8 | 3,5,7 |
| 109 | 7,875,808 | 7 | 8 | 5,1,7 |
| 110 | 9,120,352 | 7 | 10 | 5,1,7,3 |
| 111 | 10,722,400 | 7 | 10 | 5,3,7,1 |
| 112 | 12,133,728 | 7 | 8 | 5,3,7 |
| 118 | 12,169,568 | 7 | 5 | 5,1,7 |
| 119 | 13,695,840 | 7 | 6 | 5,7,3,1 |
| 120 | 14,796,128 | 7 | 5 | 5,3,7 |
| 127 | 16,086,496 | 7 | 3 | 5,7,1 |

TABLE 2b-continued
Odd Decode Table

| Index | Offset | Sign bits | Perm. type | Coords. |
|---|---|---|---|---|
| 146 | 2,035,008 | 7 | 1 | 1,7 |
| 147 | 2,657,088 | 7 | 5 | 1,7,3 |
| 148 | 3,397,184 | 7 | 9 | 1,7,3 |
| 149 | 4,287,168 | 7 | 12 | 3,1,7 |
| 150 | 5,308,864 | 7 | 9 | 3,7,1 |
| 151 | 6,475,232 | 7 | 5 | 3,7,1 |
| 152 | 7,911,648 | 7 | 1 | 3,7 |
| 155 | 4,358,848 | 7 | 5 | 1,7,5 |
| 156 | 5,362,624 | 7 | 10 | 1,7,5,3 |
| 157 | 6,496,736 | 7 | 14 | 1,7,3,5 |
| 158 | 7,915,232 | 7 | 14 | 3,7,1,5 |
| 159 | 9,227,872 | 7 | 10 | 3,7,5,1 |
| 160 | 10,829,920 | 7 | 5 | 3,7,5 |
| 164 | 8,130,272 | 7 | 9 | 1,7,5 |
| 165 | 9,335,392 | 7 | 14 | 1,7,5,3 |
| 166 | 10,851,424 | 7 | 17 | 7,5,3,1 |
| 167 | 12,191,072 | 7 | 14 | 3,7,5,1 |
| 168 | 13,738,848 | 7 | 9 | 3,7,5 |
| 173 | 12,406,112 | 7 | 12 | 5,1,7 |
| 174 | 13,792,608 | 7 | 14 | 5,7,1,3 |
| 175 | 14,817,632 | 7 | 14 | 5,7,3,1 |
| 176 | 16,093,664 | 7 | 12 | 5,3,7 |
| 182 | 16,165,344 | 7 | 9 | 5,7,1 |
| 219 | 8,184,032 | 7 | 4 | 1,7 |
| 220 | 9,550,432 | 7 | 8 | 1,7,3 |
| 221 | 11,173,984 | 7 | 12 | 7,1,3 |
| 222 | 12,477,792 | 7 | 12 | 7,3,1 |
| 223 | 14,007,648 | 7 | 8 | 3,7,1 |
| 224 | 15,032,672 | 7 | 4 | 3,7 |
| 228 | 12,549,472 | 7 | 8 | 1,7,5 |
| 229 | 14,043,488 | 7 | 13 | 7,1,5,3 |
| 230 | 15,039,840 | 7 | 14 | 7,3,1,5 |
| 231 | 16,219,104 | 7 | 13 | 7,3,5,1 |
| 237 | 16,362,464 | 7 | 12 | 7,1,5 |
| 292 | 16,434,144 | 7 | 7 | 7,1 |
| 293 | 1,112,000 | 7 | 1 | 1,9 |
| 294 | 1,596,416 | 7 | 3 | 1,9,3 |
| 295 | 2,109,376 | 7 | 5 | 1,3,9 |
| 296 | 2,826,432 | 7 | 8 | 1,3,9 |
| 297 | 3,628,352 | 7 | 8 | 3,1,9 |
| 298 | 4,676,032 | 7 | 5 | 3,1,9 |
| 299 | 5,772,544 | 7 | 3 | 3,9,1 |
| 300 | 7,206,368 | 7 | 1 | 3,9 |
| 302 | 2,862,272 | 7 | 3 | 1,9,5 |
| 303 | 3,664,192 | 7 | 6 | 1,9,5,3 |
| 304 | 4,697,536 | 7 | 10 | 1,3,9,5 |
| 305 | 5,779,712 | 7 | 13 | 3,1,9,5 |
| 306 | 7,207,392 | 7 | 10 | 3,1,9,5 |
| 307 | 8,570,208 | 7 | 6 | 3,9,5,1 |
| 308 | 10,202,272 | 7 | 3 | 3,9,5 |
| 311 | 5,923,072 | 7 | 5 | 1,5,9 |
| 312 | 7,314,912 | 7 | 10 | 1,5,9,3 |
| 313 | 8,613,216 | 7 | 14 | 1,5,3,9 |
| 314 | 10,209,888 | 7 | 14 | 3,5,1,9 |
| 315 | 11,729,504 | 7 | 10 | 3,5,9,1 |
| 316 | 13,268,320 | 7 | 5 | 3,5,9 |
| 320 | 10,424,928 | 7 | 8 | 1,5,9 |
| 321 | 11,837,024 | 7 | 13 | 5,1,9,3 |
| 322 | 13,289,824 | 7 | 14 | 5,3,1,9 |
| 323 | 14,523,744 | 7 | 13 | 5,3,9,1 |
| 324 | 15,900,000 | 7 | 8 | 3,5,9 |
| 329 | 14,667,104 | 7 | 8 | 5,1,9 |
| 330 | 15,935,840 | 7 | 10 | 5,1,9,3 |

Mask Tables
Table M87

| 0 | 01111111 | 2 | 11011111 | 4 | 11110111 | 6 | 11111101 |
| 1 | 10111111 | 3 | 11101111 | 5 | 11111011 | 7 | 11111110 |

Table M86

| 0 | 00111111 | 7 | 10011111 | 14 | 11010111 | 21 | 11101110 |
| 1 | 01011111 | 8 | 10101111 | 15 | 11011011 | 22 | 11110011 |
| 2 | 01101111 | 9 | 10110111 | 16 | 11011101 | 23 | 11110101 |
| 3 | 01110111 | 10 | 10111011 | 17 | 11011110 | 24 | 11110110 |
| 4 | 01111011 | 11 | 10111101 | 18 | 11100111 | 25 | 11111001 |
| 5 | 01111101 | 12 | 10111110 | 19 | 11101011 | 26 | 11111010 |
| 6 | 01111110 | 13 | 11001111 | 20 | 11101101 | 27 | 11111100 |

Table M85

| 0 | 00011111 | 14 | 01101110 | 28 | 10101101 | 42 | 11010110 |
| 1 | 00101111 | 15 | 01110011 | 29 | 10101110 | 43 | 11011001 |
| 2 | 00110111 | 16 | 01110101 | 30 | 10110011 | 44 | 11011010 |
| 3 | 00111011 | 17 | 01110110 | 31 | 10110101 | 45 | 11011100 |
| 4 | 00111101 | 18 | 01111001 | 32 | 10110110 | 46 | 11100011 |
| 5 | 00111110 | 19 | 01111010 | 33 | 10111001 | 47 | 11100101 |
| 6 | 01001111 | 20 | 01111100 | 34 | 10111010 | 48 | 11100110 |
| 7 | 01010111 | 21 | 10001111 | 35 | 10111100 | 49 | 11101001 |
| 8 | 01011011 | 22 | 10010111 | 36 | 11000111 | 50 | 11101010 |
| 9 | 01011101 | 23 | 10011011 | 37 | 11001011 | 51 | 11101100 |
| 10 | 01011110 | 24 | 10011101 | 38 | 11001101 | 52 | 11110001 |
| 11 | 01100111 | 25 | 10011110 | 39 | 11001110 | 53 | 11110010 |
| 12 | 01101011 | 26 | 10100111 | 40 | 11010011 | 54 | 11110100 |
| 13 | 01101101 | 27 | 10101011 | 41 | 11010101 | 55 | 11111000 |

Table M84

| 0 | 00001111 | 18 | 01001110 | 36 | 10001011 | 54 | 10111000 |
| 1 | 00010111 | 19 | 01010011 | 37 | 10001101 | 55 | 11000011 |
| 2 | 00011011 | 20 | 01010101 | 38 | 10001110 | 56 | 11000101 |
| 3 | 00011101 | 21 | 01010110 | 39 | 10010011 | 57 | 11000110 |
| 4 | 00011110 | 22 | 01011001 | 40 | 10010101 | 58 | 11001001 |
| 5 | 00100111 | 23 | 01011010 | 41 | 10010110 | 59 | 11001010 |
| 6 | 00101011 | 24 | 01011100 | 42 | 10011001 | 60 | 11001100 |
| 7 | 00101101 | 25 | 01100011 | 43 | 10011010 | 61 | 11010001 |
| 8 | 00101110 | 26 | 01100101 | 44 | 10011100 | 62 | 11010010 |
| 9 | 00110011 | 27 | 01100110 | 45 | 10100011 | 63 | 11010100 |
| 10 | 00110101 | 28 | 01101001 | 46 | 10100101 | 64 | 11011000 |
| 11 | 00110110 | 29 | 01101010 | 47 | 10100110 | 65 | 11100001 |
| 12 | 00111001 | 30 | 01101100 | 48 | 10101001 | 66 | 11100010 |
| 13 | 00111010 | 31 | 01110001 | 49 | 10101010 | 67 | 11100100 |
| 14 | 00111100 | 32 | 01110010 | 50 | 10101100 | 68 | 11101000 |
| 15 | 01000111 | 33 | 01110100 | 51 | 10110001 | 69 | 11110000 |
| 16 | 01001011 | 34 | 01111000 | 52 | 10110010 |  |  |
| 17 | 01001101 | 35 | 10000111 | 53 | 10110100 |  |  |

Table M83

| 0 | 00000111 | 14 | 00101010 | 28 | 01010100 | 42 | 10010010 |
| 1 | 00001011 | 15 | 00101100 | 29 | 01011000 | 43 | 10010100 |
| 2 | 00001101 | 16 | 00110001 | 30 | 01100001 | 44 | 10011000 |
| 3 | 00001110 | 17 | 00110010 | 31 | 01100010 | 45 | 10100001 |
| 4 | 00010011 | 18 | 00110100 | 32 | 01100100 | 46 | 10100010 |
| 5 | 00010101 | 19 | 00111000 | 33 | 01101000 | 47 | 10100100 |
| 6 | 00010110 | 20 | 01000011 | 34 | 01110000 | 48 | 10101000 |
| 7 | 00011001 | 21 | 01000101 | 35 | 10000011 | 49 | 10110000 |
| 8 | 00011010 | 22 | 01000110 | 36 | 10000101 | 50 | 11000001 |
| 9 | 00011100 | 23 | 01001001 | 37 | 10000110 | 51 | 11000010 |
| 10 | 00100011 | 24 | 01001010 | 38 | 10001001 | 52 | 11000100 |
| 11 | 00100101 | 25 | 01001100 | 39 | 10001010 | 53 | 11001000 |
| 12 | 00100110 | 26 | 01010001 | 40 | 10001100 | 54 | 11010000 |
| 13 | 00101001 | 27 | 01010010 | 41 | 10010001 | 55 | 11100000 |

Table M82

| 0 | 00000011 | 7 | 00010010 | 14 | 00110000 | 21 | 10000001 |
| 1 | 00000101 | 8 | 00010100 | 15 | 01000001 | 22 | 10000010 |
| 2 | 00000110 | 9 | 00011000 | 16 | 01000010 | 23 | 10000100 |
| 3 | 00001001 | 10 | 00100001 | 17 | 01000100 | 24 | 10001000 |
| 4 | 00001010 | 11 | 00100010 | 18 | 01001000 | 25 | 10010000 |
| 5 | 00011100 | 12 | 00100100 | 19 | 01010000 | 26 | 10100000 |
| 6 | 00010001 | 13 | 00101000 | 20 | 01100000 | 27 | 11000000 |

Table M21

| 0 | 00000001 |
| 1 | 00000010 |

Table M531

| 0 | 000000111 | 00000001 | 10 | 00000111 | 00000010 |
| 1 | 00001011 | 00000001 | 11 | 00001011 | 00000010 |
| 2 | 00001101 | 00000001 | 12 | 00001101 | 00000010 |
| 3 | 00001110 | 00000001 | 13 | 00001110 | 00000010 |
| 4 | 00010011 | 00000001 | 14 | 00010011 | 00000010 |
| 5 | 00010101 | 00000001 | 15 | 00010101 | 00000010 |
| 6 | 00010110 | 00000001 | 16 | 00010110 | 00000010 |
| 7 | 00011001 | 00000001 | 17 | 00011001 | 00000010 |
| 8 | 00011010 | 00000001 | 18 | 00011010 | 00000010 |
| 9 | 00011100 | 00000001 | 19 | 00011100 | 00000010 |

Table M522

| 0 | 00000011 | 00000011 | 15 | 00001100 | 00000101 |
| 1 | 00000101 | 00000011 | 16 | 00010001 | 00000101 |
| 2 | 00000110 | 00000011 | 17 | 00010010 | 00000101 |
| 3 | 00001001 | 00000011 | 18 | 00010100 | 00000101 |
| 4 | 00001010 | 00000011 | 19 | 00011000 | 00000101 |

Mask Tables

| 5 | 00001100 | 00000011 | 20 | 00000011 | 00000110 |
| 6 | 00010001 | 00000011 | 21 | 00000101 | 00000110 |
| 7 | 00010010 | 00000011 | 22 | 00000110 | 00000110 |
| 8 | 00010100 | 00000011 | 23 | 00001001 | 00000110 |
| 9 | 00011000 | 00000011 | 24 | 00001010 | 00000110 |
| 10 | 00000011 | 00000101 | 25 | 00001100 | 00000110 |
| 11 | 00000101 | 00000101 | 26 | 00010001 | 00000110 |
| 12 | 00000110 | 00000101 | 27 | 00010010 | 00000110 |
| 13 | 00001001 | 00000101 | 28 | 00010100 | 00000110 |
| 14 | 00001010 | 00000101 | 29 | 00011000 | 00000110 |

Table M421

| 0 | 00000011 | 00000001 | 6 | 00000011 | 00000010 |
| 1 | 00000101 | 00000001 | 7 | 00000101 | 00000010 |
| 2 | 00000110 | 00000001 | 8 | 00000110 | 00000010 |
| 3 | 00001001 | 00000001 | 9 | 00001001 | 00000010 |
| 4 | 00001010 | 00000001 | 10 | 00001010 | 00000010 |
| 5 | 00001100 | 00000001 | 11 | 00001100 | 00000010 |

Table M311

| 0 | 00000001 | 00000001 | 3 | 00000001 | 00000010 |
| 1 | 00000010 | 00000001 | 4 | 00000010 | 00000010 |
| 2 | 00000100 | 00000001 | 5 | 00000100 | 00000010 |

Table M5211

| 0 | 00000011 | 00000001 | 00000001 |
| 1 | 00000101 | 00000001 | 00000001 |
| 2 | 00000110 | 00000001 | 00000001 |
| 3 | 00001001 | 00000001 | 00000001 |
| 4 | 00001010 | 00000001 | 00000001 |
| 5 | 00001100 | 00000001 | 00000001 |
| 6 | 00010001 | 00000001 | 00000001 |
| 7 | 00010010 | 00000001 | 00000001 |
| 8 | 00010100 | 00000001 | 00000001 |
| 9 | 00011000 | 00000001 | 00000001 |
| 10 | 00000011 | 00000010 | 00000001 |
| 11 | 00000101 | 00000010 | 00000001 |
| 12 | 00000110 | 00000010 | 00000001 |
| 13 | 00001001 | 00000010 | 00000001 |
| 14 | 00001010 | 00000010 | 00000001 |
| 15 | 00001100 | 00000010 | 00000001 |
| 16 | 00010001 | 00000010 | 00000001 |
| 17 | 00010010 | 00000010 | 00000001 |
| 18 | 00010100 | 00000010 | 00000001 |
| 19 | 00011000 | 00000010 | 00000001 |
| 20 | 00000011 | 00000100 | 00000001 |
| 21 | 00000101 | 00000100 | 00000001 |
| 22 | 00000110 | 00000100 | 00000001 |
| 23 | 00001001 | 00000100 | 00000001 |
| 24 | 00001010 | 00000100 | 00000001 |
| 25 | 00001100 | 00000100 | 00000001 |
| 26 | 00010001 | 00000100 | 00000001 |
| 27 | 00010010 | 00000100 | 00000001 |
| 28 | 00010100 | 00000100 | 00000001 |
| 29 | 00011000 | 00000100 | 00000001 |
| 30 | 00000011 | 00000001 | 00000010 |
| 31 | 00000101 | 00000001 | 00000010 |
| 32 | 00000110 | 00000001 | 00000010 |
| 33 | 00001001 | 00000001 | 00000010 |
| 34 | 00001010 | 00000001 | 00000010 |
| 35 | 00001100 | 00000001 | 00000010 |
| 36 | 00010001 | 00000001 | 00000010 |
| 37 | 00010010 | 00000001 | 00000010 |
| 38 | 00010100 | 00000001 | 00000010 |
| 39 | 00011000 | 00000001 | 00000010 |
| 40 | 00000011 | 00000010 | 00000010 |
| 41 | 00000101 | 00000010 | 00000010 |
| 42 | 00000110 | 00000010 | 00000010 |
| 43 | 00001001 | 00000010 | 00000010 |
| 44 | 00001010 | 00000010 | 00000010 |
| 45 | 00001100 | 00000010 | 00000010 |
| 46 | 00010001 | 00000010 | 00000010 |
| 47 | 00010010 | 00000010 | 00000010 |
| 48 | 00010100 | 00000010 | 00000010 |
| 49 | 00011000 | 00000010 | 00000010 |
| 50 | 00000011 | 00000100 | 00000010 |
| 51 | 00000101 | 00000100 | 00000010 |
| 52 | 00000110 | 00000100 | 00000010 |
| 53 | 00001001 | 00000100 | 00000010 |
| 54 | 00001010 | 00000100 | 00000010 |
| 55 | 00001100 | 00000100 | 00000010 |
| 56 | 00010001 | 00000100 | 00000010 |
| 57 | 00010010 | 00000100 | 00000010 |
| 58 | 00010100 | 00000100 | 00000010 |
| 59 | 00011000 | 00000100 | 00000010 |

Table M4111

| 0 | 00000001 | 00000001 | 00000001 |
| 1 | 00000010 | 00000001 | 00000001 |
| 2 | 00000100 | 00000001 | 00000001 |
| 3 | 00001000 | 00000001 | 00000001 |
| 4 | 00000001 | 00000010 | 00000001 |
| 5 | 00000010 | 00000010 | 00000001 |
| 6 | 00000100 | 00000010 | 00000001 |
| 7 | 00001000 | 00000010 | 00000001 |
| 8 | 00000001 | 00000100 | 00000001 |
| 9 | 00000010 | 00000100 | 00000001 |
| 10 | 00000100 | 00000100 | 00000001 |
| 11 | 00001000 | 00000100 | 00000001 |
| 12 | 00000001 | 00000001 | 00000010 |
| 13 | 00000010 | 00000001 | 00000010 |
| 14 | 00000100 | 00000001 | 00000010 |
| 15 | 00001000 | 00000001 | 00000010 |
| 16 | 00000001 | 00000010 | 00000010 |
| 17 | 00000010 | 00000010 | 00000010 |
| 18 | 00000100 | 00000010 | 00000010 |
| 19 | 00001000 | 00000010 | 00000010 |
| 20 | 00000001 | 00000100 | 00000010 |
| 21 | 00000010 | 00000100 | 00000010 |
| 22 | 00000100 | 00000100 | 00000010 |
| 23 | 00001000 | 00000100 | 00000010 |

Table P8

| 00000000 | 0 | 01000000 | 6 | 10000000 | 7 | 11000000 | 27 |
| 00000001 | 0 | 01000001 | 15 | 10000001 | 21 | 11000001 | 50 |
| 00000010 | 1 | 01000010 | 16 | 10000010 | 22 | 11000010 | 51 |
| 00000011 | 0 | 01000011 | 20 | 10000011 | 35 | 11000011 | 55 |
| 00000100 | 2 | 01000100 | 17 | 10000100 | 23 | 11000100 | 52 |
| 00000101 | 1 | 01000101 | 21 | 10000101 | 36 | 11000101 | 56 |
| 00000110 | 2 | 01000110 | 22 | 10000110 | 37 | 11000110 | 57 |
| 00000111 | 0 | 01000111 | 15 | 10000111 | 35 | 11000111 | 36 |
| 00001000 | 3 | 01001000 | 18 | 10001000 | 24 | 11001000 | 53 |
| 00001001 | 3 | 01001001 | 23 | 10001001 | 38 | 11001001 | 58 |
| 00001010 | 4 | 01001010 | 24 | 10001010 | 39 | 11001010 | 59 |
| 00001011 | 1 | 01001011 | 16 | 10001011 | 36 | 11001011 | 37 |
| 00001100 | 5 | 01001100 | 25 | 10001100 | 40 | 11001100 | 60 |
| 00001101 | 2 | 01001101 | 17 | 10001101 | 37 | 11001101 | 38 |
| 00001110 | 3 | 01001110 | 18 | 10001110 | 38 | 11001110 | 39 |
| 00001111 | 0 | 01001111 | 6 | 10001111 | 21 | 11001111 | 13 |
| 00010000 | 4 | 01010000 | 19 | 10010000 | 25 | 11010000 | 54 |
| 00010001 | 6 | 01010001 | 26 | 10010001 | 41 | 11010001 | 61 |
| 00010010 | 7 | 01010010 | 27 | 10010010 | 42 | 11010010 | 62 |
| 00010011 | 4 | 01010011 | 19 | 10010011 | 39 | 11010011 | 40 |
| 00010100 | 8 | 01010100 | 28 | 10010100 | 43 | 11010100 | 63 |
| 00010101 | 5 | 01010101 | 20 | 10010101 | 40 | 11010101 | 41 |
| 00010110 | 6 | 01010110 | 21 | 10010110 | 41 | 11010110 | 42 |
| 00010111 | 1 | 01010111 | 7 | 10010111 | 22 | 11010111 | 14 |
| 00011000 | 9 | 01011000 | 29 | 10011000 | 44 | 11011000 | 64 |
| 00011001 | 7 | 01011001 | 22 | 10011001 | 42 | 11011001 | 43 |
| 00011010 | 8 | 01011010 | 23 | 10011010 | 43 | 11011010 | 44 |
| 00011011 | 2 | 01011011 | 8 | 10011011 | 23 | 11011011 | 15 |
| 00011100 | 9 | 01011100 | 24 | 10011100 | 44 | 11011100 | 45 |
| 00011101 | 3 | 01011101 | 9 | 10011101 | 24 | 11011101 | 16 |
| 00011110 | 4 | 01011110 | 10 | 10011110 | 25 | 11011110 | 17 |
| 00011111 | 0 | 01011111 | 1 | 10011111 | 7 | 11011111 | 2 |
| 00100000 | 5 | 01100000 | 20 | 10100000 | 26 | 11100000 | 55 |
| 00100001 | 10 | 01100001 | 30 | 10100001 | 45 | 11100001 | 65 |
| 00100010 | 11 | 01100010 | 31 | 10100010 | 46 | 11100010 | 66 |
| 00100011 | 10 | 01100011 | 25 | 10100011 | 45 | 11100011 | 46 |
| 00100100 | 12 | 01100100 | 32 | 10100100 | 47 | 11100100 | 67 |
| 00100101 | 11 | 01100101 | 26 | 10100101 | 46 | 11100101 | 47 |
| 00100110 | 12 | 01100110 | 27 | 10100110 | 47 | 11100110 | 48 |
| 00100111 | 5 | 01100111 | 11 | 10100111 | 26 | 11100111 | 18 |
| 00101000 | 13 | 01101000 | 33 | 10101000 | 48 | 11101000 | 68 |
| 00101001 | 13 | 01101001 | 28 | 10101001 | 48 | 11101001 | 49 |
| 00101010 | 14 | 01101010 | 29 | 10101010 | 49 | 11101010 | 50 |
| 00101011 | 6 | 01101011 | 12 | 10101011 | 27 | 11101011 | 19 |
| 00101100 | 15 | 01101100 | 30 | 10101100 | 50 | 11101100 | 51 |
| 00101101 | 7 | 01101101 | 13 | 10101101 | 28 | 11101101 | 20 |
| 00101110 | 8 | 01101110 | 14 | 10101110 | 29 | 11101110 | 21 |
| 00101111 | 1 | 01101111 | 2 | 10101111 | 8 | 11101111 | 3 |
| 00110000 | 14 | 01110000 | 34 | 10110000 | 49 | 11110000 | 69 |
| 00110001 | 16 | 01110001 | 31 | 10110001 | 51 | 11110001 | 52 |
| 00110010 | 17 | 01110010 | 32 | 10110010 | 52 | 11110010 | 53 |
| 00110011 | 9 | 01110011 | 15 | 10110011 | 30 | 11110011 | 22 |

-continued

| Mask Tables | | | | | | | |
|---|---|---|---|---|---|---|---|
| 00110100 | 18 | 01110100 | 33 | 10110100 | 53 | 11110100 | 54 |
| 00110101 | 10 | 01110101 | 16 | 10110101 | 31 | 11110101 | 23 |
| 00110110 | 11 | 01110110 | 17 | 10110110 | 32 | 11110110 | 24 |
| 00110111 | 2 | 01110111 | 3 | 10110111 | 9 | 11110111 | 4 |
| 00111000 | 19 | 01111000 | 34 | 10111000 | 54 | 11111000 | 55 |
| 00111001 | 12 | 01111001 | 18 | 10111001 | 33 | 11111001 | 25 |
| 00111010 | 13 | 01111010 | 19 | 10111010 | 34 | 11111010 | 26 |
| 00111011 | 3 | 01111011 | 4 | 10111011 | 10 | 11111011 | 5 |
| 00111100 | 14 | 01111100 | 20 | 10111100 | 35 | 11111100 | 27 |
| 00111101 | 4 | 01111101 | 5 | 10111101 | 11 | 11111101 | 6 |
| 00111110 | 5 | 01111110 | 6 | 10111110 | 12 | 11111110 | 7 |
| 00111111 | 0 | 01111111 | 0 | 10111111 | 1 | 11111111 | 0 |

The following comments may be useful in combination with the above program.

With regard to encode steps 8,9,10 where a mask is specified one higher than the masks provided by the 'mask settings' in step 5 then it will be recalled (introduction to encode step 5) that all masks not specified are set to all ones.

Decoding step 12 ends with the instruction: "add the value of the high order B bits of S" refers to the value of the high order B bits as if the remaining bits were not existent. Thus where:

S=00100000 and B is 3 the value in question is one and not 32 and where S=01010100 and B is 7 the value in question is 42 rather than 84.

It will be noted that in a mask for a second or higher coordinate which is the highest numbered mask used will have the value 1 1 1 1 1 1 1 1 (see encode step 5) but only a limited number (e.g.2) of the right hand "ones" are used by 'right shifting'. The decode reconstruction of this mask uses a mask starting at all zeros and left shifts in the ones to the same limited number. (Decode steps 7-9). Thus although the decode reconstruction for 2 shifts is 0 0 0 0 0 0 1 1 differs from the encode value of the same mask 1 1 1 1 1 1 1 1 it makes no difference to the program since only the right hand "limited" number of digits are used and these will be "ones" in both the encode and decode mask.

It will be noted that differential encoding may be added to the above system to avoid the difficulties of a carrier phase ambiguity of a multiple of 90°. Such an ambiguity rotates the signal sapce through a "Clifford Displacement". For differential encoding each message point may be assigned a quadrant as determined by the two dimensional quadrant of the first baud (or the first pair of the eight signals whether considered a baud or not). To perform such differential encoding, the message point may be rotated by an amount determined by the quadrant of the previous symbol. The coordinates of the message point thus rotated are modulated on the carrier for transmission. The detected coordinates at the receiver are treated to the inverse of the above rotation to extract the encoded coordinates which existed before rotation at the transmitter. Since differential encoding and decoding are well known to those skilled in the art, the differential encoding and decoding steps are omitted from the program and the discussion of the invention although the invention includes means and methods incorporating such steps.

It should be noted that one of the advantages of the preferred means and method described for use with the microprocessor is the use of permutation masks to control the assignment of the particular blocks of b binary digits, represented by their corresponding number N, to specific message points on a sub-shell. All message points on a sub-shell represent the same combination of absolute coordinate values (although with a different permutation of such absolute values with permutation also as to the sign of non zero values). The same tables of mask values may be used whenever the eight coordinates contain the same distribution of different coordinates, i.e. A1 ... An1,B1 ... Bn2, C1 ... Cn2 etc. where the total number of the coordinates is 8 and n1 the number of the commonest coordinate A, n2 the number of the next commonest coordinate B are the same and so on.

This is illustrated in connection with steps 5 to 13 of the encode program where only 4 masks and 18 permutation types achieved by tables of mask values can be used to assign message points to over 16 million message points in 225 different ranges. Coordinate combinations are shown for the masks used are where A is the most common coordinate of the 8, B the next commonest coordinate and so on.

This is illustrated by the table of coordinates in terms of A,B,C as described above.

| Permutation Type | Coordinate Combination of. |
|---|---|
| 0 | AAAAAAAA |
| 1 | AAAAAAAB |
| 2 | AAAAAABB |
| 3 | AAAAAABC |
| 4 | AAAAABBB |
| 5 | AAAAABBC |
| 6 | AAAAABCD |
| 7 | AAAABBBB |
| 8 | AAAABBBC |
| 9 | AAAABBCC |
| 10 | AAAABBCD |
| 11 | AAAABCDE |
| 12 | AAABBBCC |
| 13 | AAABBBCD |
| 14 | AAABBCCD |
| 15 | AAABBCDE |
| 17 | AABBCCDD |
| 18 | AABBCCDE |

(It will be noted that permutation type 16 is omitted. Such type would represent the combination AAABC-DEF. In the lowest coordinate values available in this combination the coordinates would be 0, 0, 0, 2, 4, 6, 8, 10. The presence of the high coordinates 8 and 10 in the same block of 8 coordinates which could occur in the same two coordinate baud would represent a peak energy requirement for transmission in one baud of the block which is higher than desired and possible peak energy requirements with other coordinates used with such permutation type would be even higher. Accordingly, the permutation type and its corresponding sub-shell were omitted from the table and from the encoding-decoding procedure). At the signalling speeds discussed in the preferred embodiment or at alternative signalling speeds, sub-shells may be selectively omitted from the tables and program at the choice of the designer.

It will be appreciated that the classification of message points by sub-shells where all message point coordinates have the same absolute values allows very efficient encoding and decoding procedures. It is also efficient and economical of system steps and processor capacity to provide a relatively small number (18) of permutation types controlled by tables of mask values available to assign the message points to particular permutations of absolute values. The absolute values are of course further permutated for assignment to message points by selection of the signs of the absolute values.

FIG. 1 schematically illustrates the functional operations performed in a communications system utilizing the invention. The functional operations are not intended to imply particular hardware or choices between hardware and software modes except in those blocks entitled "microprocessor producing 4 pairs of message point coordinates" "microprocessor detector"; and "microprocessor decoder to b bits" where the operation is performed by microprocessors at the transmission and reception ends respectively. Further the invention is not limited to use with microprocessors but may be used with any system adapted to provide the claimed means or methods.

Thus as functionally illustrated in FIG. 1 serial binary data in blocks of b bits is converted at serial to parallel convertor 10 into groups of b bits. Such groups of b bits are block encoded at block 20 into 8 message point coordinates in accord with the encode portion of the program described. The block of 8 message point coordinates may be differentially encoded as already described. A coordinate signal generator 30 and a carrier generator 40 provide the signals to provide the carriers modulated in accord with quadrature modulation with signals embodying successive groups of four pairs of signals representing the eight block encoded coordinates of a message point. The signals generated by signal generator 30 and carrier generator 40 are provided from transmitter interface 50 to the channel. After reception at receiver interface 60 the received signals are demodulated, conditioned and equalized and provided to micprocessor detector 80 where they are processed in accord with the "detection" portion of the program previously described. The detected coordinates are provided to the decoder 90 which converts these coordinates S1,S2 ... Sn into b bits of parallel binary data which absent error will correspond to the b bits transferred from convertor 10 to microprocessor 20. The constituted b bits are converted to serial data at convertor 100. The above cycle involving the encoding of binary bits into 8 coordinate signals and resultant decoding at the receiver will customarily be performed 600 times per second with the signalling speed in bits per second of bits b being determined by the number of bits b which are block encoded to correspond to each eight coordinates. Circuitry for performing the functions described excepting those of blocks 20, 80 and 90 is well known to those skilled in the art. The advantages of the system involved in the selection and use of particular message points in 8 dimensional space and of the method of encoding to and decoding from such message points is elsewhere discussed.

It is now desired to describe one cycle of the encode-decode process having regard to the program previously described in detail and to the system of FIG. 1.

Accordingly, with serial binary data arriving at convertor 10, a block 24 of such bits (i.e. b=24) will be provided to microprocessor 20. In this example the 24 bits: are 0010, 0110, 0011, 0001, 0011, 0010. This block of 24 bits is treated as the number N=2,502,762 obtained when the above block is treated as a binary number. The encode and decode steps of the program will be represented as 'Step 1' etc.

ENCODE

| | |
|---|---|
| Step 1 | a scan of Table 1 main encode TABLE derives Offset |

-continued
ENCODE

| | |
|---|---|
| | value 2,442,048. It will be noted that for this offset value Table 1 gives the: |
| | Sign Bits-the number of permissible permutation by sign (7) |
| | Permutation type (10) |
| | Coordinate type ODD |
| | Sign Parity ODD |
| | Coordinates (e.g. A.B.C etc) 3,1,7,5 |
| Step 2 | N minus offset value is 60714 |
| Step 3 | R (quotient) is 474 |
| | S 84 |
| | S as an eight bit quantity is 01010100 |
| Step 4 | no adjustment |
| Step 5 | Permutation type 10 produces the mask values |
| | M1 1 0 1 1 1 1 0 0 0 |
| | M2 0 0 0 0 0 0 1 1 |
| | M3 0 0 0 0 0 0 1 0 |
| | M4 1 1 1 1 1 1 1 1 |

(In determining the coordinates, 'RS' and 'LS' mean 'right shift' and 'left shift' respectively and Step 7-2 means Step 7, 2nd cycle, "CA" means the absolute value of the coordinate)

| Step | | | | |
|---|---|---|---|---|
| Step 7-1 | RS | M1 | 1 0 1 1 1 0 0/0 | |
| 8-1 | RS | M2 | 0 0 0 0 0 0 1/1 | CA is 1 |
| 12-1 | LS | S | 0/1 0 1 0 1 0 0 | |
| | First coordinate S1 is 1 | | | |
| Step 7-2 | RS | M1 | 1 0 1 1 1 0/0 | |
| 8-2 | RS | M2 | 0 0 0 0 0 0/1 | CA is 1 |
| 12-2 | LS | S | 1/0 1 0 1 0 0 | |
| | Second coordinate S2 is −1 | | | |
| Step 7-3 | RS | M1 | 1 0 1 1 1/0 | |
| 8-3 | RS | M2 | 0 0 0 0 0/0 | |
| 9-3 | RS | M3 | 0 0 0 0 0 0 1/0 | |
| 10-3 | RS | M4 | 1 1 1 1 1 1 1/1 | CA is 5 |
| 12-3 | LS | S | 0/1 0 1 0 0 | |
| | Third coordinate S3 is 5 | | | |
| Step 7-4 | RS | M1 | 1 0 1 1/1 | CA is 3 |
| | LS | S | 1/0 1 0 0 | |
| | Fourth coordinate S4 is 3 | | | |
| Step 7-5 | RS | M1 | 1 0 1/1 | CA is 3 |
| | LS | S | 0/1 0 0 | |
| | Fifth coordinate S5 is 3 | | | |
| Step 7-6 | RS | M1 | 1 0/1 | CA is 3 |
| 12-6 | LS | S | 1/0 0 | |
| | Sixth coordinate S6 is −3 | | | |
| Step 7-7 | RS | M1 | 1/0 | |
| 8-7 | RS | M2 | 0 0 0 0/0 | |
| 9-7 | RS | M3 | 0 0 0 0 0 0/1 | CA is 7 |
| 12-7 | LS | S | 0/0 | |
| | Seventh coordinate S7 is 7 | | | |
| Step 7-8 | RS | M1 | /1 | CA is 1 |
| | LS | S | 0/ | |
| | Eighth coordinate S8 is 3 | | | |

Thus the coordinates S1, S2 ... S8 to be QAM modulated on the carrier and transmitted from 50 are 1, −1, 5, −3,3, −3,7, 3.

(The program will be described omitting the steps of differential encoding at the transmitter end and differential decoding at the receiver end. Such added steps may be taken in accord with the directions previously and referred to hereafter).

The above coordinates, modulated on the carrier are received at interface 60 and with the received signal conditioned, demodulated and equalized at block 70.

The demodulated signals are provided to the microprocessor detector 80 in accord with the detection portion of the program. This portion of the program will not be reviewed. It is assumed that the signal is that which was transmitted i.e. 1, −1, 5, −3, 3, −3, 7, 3.

| DECODE | | |
|---|---|---|
| Step 1 | Set S = 0 0 0 0 0 0 0 0 | |
| | Scanning coordinates in reverse sequence and RS S in accord with the program gives S 0 1 0 1 0 1 0 0 (as determined during encoding) | |
| Step 2 | Replace each coordinate with absolute value gives 1 1 5 3 3 3 7 3 | |
| Step 3 | Computer index gives 86 | |
| Step 4 | Odd decoding table 2b for index 86 gives | |
| | Offset | 2 4 4 2 0 4 8 |
| | Sign Bits | 7 |
| | Perm Type | 10 |
| | Coordinates | 3, 1, 7, 5 |
| Step 5-6 | are the cyclical generation of eight bits with all masks initially set to all zeros. Scan the received coordinates in reverse sequence | |
| Step 6-1 | 1 1 5 3 3 3 7 3 (= 1st Coord) | |
| | LS M1 | 0 0 0 0 0 0 0 1 |
| Step 6-2 | 1 1 5 3 3 3 7 (= 3rd Coord) | |
| | LS M1 | 0 0 0 0 0 0 1 0 |
| 7-2 | LS M2 | 0 0 0 0 0 0 0 0 |
| 8-3 | LS M3 | 0 0 0 0 0 0 0 1 |
| Step 6-3 | 1 1 5 3 3 3 | |
| | LS M1 | 0 0 0 0 0 1 0 1 |
| Step 6-4 | 1 1 5 3 3 | |
| | LS M1 | 0 0 0 0 1 0 1 1 |
| Step 6-5 | 1 1 5 3 | |
| | LS M1 | 0 0 0 1 0 1 1 1 |
| Step 6-6 | 1 1 5 | |
| | LS M1 | 0 0 1 0 1 1 1 0 |
| 7-6 | LS M2 | 0 0 0 0 0 0 0 0 |
| 8-6 | LS M3 | 0 0 0 0 0 0 1 0 |
| 9-6 | LS M4 | 0 0 0 0 0 0 0 1 |
| Step 6-7 | 1 1 | |
| | LS M1 | 0 1 0 1 1 1 0 0 |
| 7-7 | LS M2 | 0 0 0 0 0 0 0 1 |
| Step 6-8 | 1 | |
| | LS M2 | 1 0 1 1 1 0 0 0 |
| | LS M2 | 0 0 0 0 0 0 1 1 |

It will be noted that M1, M2, M2 have been constituted at the decoder in the form used for encoding. M4 differs in the first seven bits but this does not matter since only the eighth bit is used.

| Step 11 | Use permutation type (10) | |
|---|---|---|
| | Mask 1 to look up R in table P8 | |
| | Gives | 54 |
| | Because mask 3=00000010 add | 420 |
| | R is | 474 |
| Step 12 | D is 474 × 128 | 60672 |
| | High order 7 bits of S are 0101010 | |
| | which has the value | 42 |
| | Total is | D 60714 |
| | Adding D to offset value of decode step gives | 2442048 |
| | N at decoder | 2502762 |
| | corresponds to N at encoder Microprocessor 90 provides the N in binary form to convertor 100. Convertor 100 converts the binary form of N to serial form thus reconstituting, at the receiver, the original 24 bits b of binary data. The cycle described above will be repeated 600 times a second for b = 24 and a bit rate of 14400 bits/sec. | |

If differential encoding is used the following convention may be used:

Each message point shall assume the quadrant of the first baud in which the coordinates are not both zero, when examined from left to right, as outlined in Table 2.

TABLE 2

| FIRST NON ZERO COORDINATE PAIR VALUES (plus, minus or zero) | QUADRANT OF MESSAGE POINT |
|---|---|
| (+,+) or (0,+) | 0 |
| (−,+) or (−,0) | 1 |
| (−,−) or (0,−) | 2 |
| (+,−) or (+,0) | 3 |

To differentially encode the current message point, rotate it counterclockwise by $Q_{old}$ quadrants, where $Q_{old}$ is the quadrant of the previous differentially encoded message point. This is accomplished by rotating in 2-space each coordinate pair (baud) of the message point individually as illustrated in Table A4.

TABLE A4

| COORDINATE PAIR | AMOUNT OF ROTATION COUNTERCLOCKWISE (QUADRANTS) |
|---|---|
| $(C_x, C_y)$ | 0 |
| $(-C_y, C_x)$ | 1 |
| $(-C_x, -C_y)$ | 2 |
| $(C_y, -C_x)$ | 3 |

At the receiver the process of the differential encoding is reversed.

It will be noted, the differential encoding and decoding steps do not affect the coordinate relationship of the inventive process since differential encoding will retain the same combination of coordinates with permutation and sign changes which are reversed at the receiver.

I claim:

1. Means for encoding binary data in blocks of b bits into a block of eight signals and transmitting said signals modulated on a carrier, comprising:

means for providing for a selection of blocks of eight signal values S1, S2, ... S8 each of which may be considered as defining a message point in 8 dimensional space, and values for each of S1, S2, ... S8 are selected from a series of equally spaced integer values, the blocks used for signals being assigned values so that $$\sum_{k=1}^{k=8} (Sak - Sbk)^2$$

is not less than 8 where Sa1, Sa2, ... Sa8; and Sb1, Sb2 ... Sb8 are any two message points, means for defining a number N whose value identifies a particular block of b bits, means providing a table of ranges of values of N and a shell of message points corresponding to each of said ranges, where a shell comprises the message points for which $$\sum_{k=1}^{k=8} (Sk - Sdk)^2$$

is the same where values Sd1, Sd2 ... Sd8 define a datum point in said integer values in 8 dimensional space, where the table is so arranged that the range of numbers of N is not greater than the number of message points on the corresponding shell, means for determining the number N corresponding to a block of b bits, means for determining the range and the shell corresponding to the number N, means for determining the position of the number N in the range and determining a particular permutation of values SP1, SP2 ... SP8 to identify said position, means for modulating a carrier in accord with said values SP1, SP2 ... SP8, and means for transmitting on a communications channel said modulated carrier.

2. Means for encoding binary data as claimed in claim 1 wherein:

said values Sp1, SP2, ... SP8 are defined relative to a datum point, where each of Sd1, Sd2 ... Sd8 are equal to 0.

3. Means for encoding binary data as claimed in claim 2 wherein:

values S1, S2, ... S8 are chosen to define message points wherein:

the eight coordinates S1, S2, ... S8 are all even or all odd, the sum of the eight coordinates is zero modulo 4.

4. Means for encoding binary data as claimed in claim 3 wherein:

said means for providing a table of ranges of values of N provides ranges of values of N and a sub-shell corresponding to each of said ranges, where a sub-shell is a set consisting of those message points in a shell which have the same combination of absolute values of coordinates, whereby the coordinates of points in a sub-shell are different permutations of such absolute coordinate values end of the signs of such coordinates.

5. Means for encoding binary data as claimed in claim 2 wherein:

said means for providing a table of ranges of values of N provides ranges of values of N and a sub-shell corresponding to each of said ranges, where a sub-shell is a set consisting of those message points in a shell which have the same combination of absolute values of coordinates, whereby the coordinates of points in a sub-shell are different permutations of such absolute coordinate values and of the signs of such coordinate.

6. Means for encoding binary data as claimed in claim 1 wherein:

values S1, S2, ... S8 are chosen to define message points wherein:

the eight coordinates S1, S2, ... S8 are all even or all odd, the sum of the eight coordinates is zero modulo 4.

7. Means for encoding binary data as claimed in claim 6 wherein:

said means for providing a table of ranges of values of N provides ranges of values of N and a sub-shell corresponding to each of said ranges, where a sub-shell is a set consisting of those message points in a shell which have the same combination of absolute values of coordinates, whereby the coordinates of points in a sub-shell are different permutations of such absolute coordinate values and of the signs of such coordinates.

8. Means for encoding binary data in blocks of b bits into a block of eight signals and transmitting said signals modulated on a carrier, comprising:

means for providing for a selection of blocks of eight signals S1, S2, ... S8 each of which define a message point and are selected from a series of equally spaced integer values, and selected so that in said integer values, the eight values for a block are all even or all odd, and the sum of the coordinates is 0 modulo 4, means for determining a number N identifying each block of b bits, means for assigning a sub-shell of message points to each range of values of N, where the number of message points on said sub-shell is at least as great as said range, where a sub-shell of message points consists of those message points whose combination of absolute values of S1, S2, ... S8 is the same, means for each value of N in said range for determining a permutation of absolute values and permutation of signs thereof identifying said value of M to provide signals S1, S2, ... S8 identifying N, means for modulating a carrier in accord with the provided signals S1, S2, ... S8.

9. Method of encoding binary data in blocks of b bits into a block of eight signals for transmission modulated on a carrier; comprising;

detecting said block of b bits, for each block of b bits, determining a number N identifying such block, for each number N, determining a set of eight values S1, S2 ... S8 identifying the number N, where the eight values are each selected from positive, negative and zero integral values; the eight values identifying each number N are all even integrals or all odd integrals and the sum of the last mentioned eight values is 0 modulo 4, modulating a carrier in accord with the said eight values.

10. Method as claimed in claim 9 including the steps of:

providing a table of ranges of values of N where each range corresponds to a sub-shell representing a group of such sets, where a shell consists of those sets where $$\sum_{k=1}^{k=8} S k^2$$

is the same, and a sub-shell consists of sets of a shell where the combination of the absolute values of the S1, S2, ... S8 is the same, wherein the number N is identified by determining the combination of absolute values for the sub-shell corresponding to the range and determining a permutation of such absolute values and of positive and negative signs therefor, identifying said number N in said range, thereby providing the values S1, S2 ... S8 identifying N.

11. Means for encoding binary data in blocks of b bits into a block of eight signals for transmission modulated on a carrier; comprising;

means for detecting said block of b bits, means for determining a number N identifying such detected block, means, for each number N determining a set of eight values S1, S2, ... S8 identifying the number N, where the eight values are each selected from positive, negative and zero integral values; the eight values identifying each number N are all even integers or all odd integers and the sum of the last mentioned eight values is 0 modulo 4, means for modulating a carrier in accord with the said eight values.

12. Means as claimed in claim 11 including:

means providing a table of ranges of values of N where each range corresponds to a sub-shell representing a group of each sets, where a shell consists of those sets where $$\sum_{k=1}^{k=8} (Sk)^2$$

is the same, and a sub-shell consists of sets of a shell where the combination of the absolute values of S1, S2 ... S8 is the same, means for determining for each number N the combination of absolute values for the sub-shell corresponding to the range, and means for determining a permutation of said absolute values and of positive and negative signs therefor, identifying said number N in said range, thereby providing the values S1, S2, ... S8 identifying N.

13. Means for decoding received signals modulated on a carrier where the received signal values are in sets of eight S1, S2, ... S8 and each of said values represents a positive, negative or zero integer, the eight signal values in said set represent, all even or all odd integers and the sum of the integers in a set is 0 modulo 4, comprising:

means for detecting said set, of signal values, means for determining the absolute values of said signal values, means for determining the permutation of the signs of said signals, means for determining the location in said set of each one of said absolute values, means for determining a range of values of a number N from the absolute values detected, means for determining N by determining the location of N in said range responsive to said permutation determination and said location determination, means for providing binary data corresponding to N.

14. Method for decoding received signals modulated on a carrier where the received signal values are in sets of eight S1, S2, ... S8 and each of said signals represents a positive, negative or zero integral number, the eight signals in said set represent all even or all odd integers and the sum of the integers in a set is 0 modulo 4; comprising the steps of:

detecting said set, determining the absolute values of the signals in said set, determining the permutation of the signs of said signals, determining the location in said set of each one of said absolute values, determining a range of values of a number N from the absolute values detected, determining N by determining the location of N in said range responsive to said permutation determination and said location determination, providing binary data corresponding to N.

* * * * *